United States Patent
Tsujiai

(10) Patent No.: US 10,707,392 B2
(45) Date of Patent: Jul. 7, 2020

(54) SEMICONDUCTOR LIGHT-EMITTING ELEMENT

(71) Applicant: ROHM CO., LTD., Kyoto (JP)

(72) Inventor: Hideki Tsujiai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/277,518

(22) Filed: Sep. 27, 2016

(65) Prior Publication Data
US 2017/0092828 A1    Mar. 30, 2017

(30) Foreign Application Priority Data
Sep. 30, 2015   (JP) ................................ 2015-194619

(51) Int. Cl.
*H01L 33/62* (2010.01)
*H01L 33/24* (2010.01)
*H01L 33/38* (2010.01)

(52) U.S. Cl.
CPC .............. *H01L 33/62* (2013.01); *H01L 33/24* (2013.01); *H01L 33/38* (2013.01)

(58) Field of Classification Search
CPC ................................ H01L 33/38; H01L 33/62
See application file for complete search history.

(56) References Cited

U.S. PATENT DOCUMENTS

| | | | |
|---|---|---|---|
| 2008/0173885 A1 | 7/2008 | Kuromizu | |
| 2008/0283819 A1* | 11/2008 | Konno | H01L 33/0079 257/13 |
| 2010/0140635 A1* | 6/2010 | Ibbetson | H01L 33/46 257/98 |

(Continued)

FOREIGN PATENT DOCUMENTS

| | | |
|---|---|---|
| JP | H05038921 U | 5/1993 |
| JP | 2007-221029 A | 8/2007 |

(Continued)

*Primary Examiner* — Mathew C Landau
*Assistant Examiner* — Mark Hatzilambrou
(74) *Attorney, Agent, or Firm* — Rabin & Berdo, P.C.

(57) ABSTRACT

A semiconductor light-emitting element according to the present invention includes a metal layer, a light-emitting layer, a first conductivity type layer and a second conductivity type layer sandwiching the light-emitting layer, and a plurality of contact portions that electrically connects the metal layer and the first conductivity type layer. The semiconductor light-emitting element includes a surface electrode including a pad electrode and a branch-shaped electrode that extends from the pad electrode between the plurality of contact portions. Distances between the contact portions and the surface electrode satisfies the following relational expression: $d_1 > d_2 > d_3$, wherein $d_1$ represents a distance between a first contact portion in the periphery of the pad electrode among the contact portions and the pad electrode; $d_2$ represents a distance between the first contact portion and the branch-shaped electrode closest to the first contact portion; and $d_3$ represents a distance between a second contact portion spaced further away from the pad electrode than the first contact portion among the contact portions and the branch-shaped electrode closest to the second contact portion.

16 Claims, 26 Drawing Sheets

(56) References Cited

U.S. PATENT DOCUMENTS

| | | | |
|---|---|---|---|
| 2010/0301362 A1* | 12/2010 | Iizuka | H01L 33/387 257/98 |
| 2014/0014994 A1* | 1/2014 | Chen | H01L 33/405 257/98 |
| 2015/0014721 A1 | 1/2015 | Liao et al. | |

FOREIGN PATENT DOCUMENTS

| | | | |
|---|---|---|---|
| JP | 2008288248 A | 11/2008 | |
| JP | 2009076490 A | 4/2009 | |
| JP | 2010186802 A | 8/2010 | |
| JP | 2010278112 A | 12/2010 | |
| JP | 2011166139 A | 8/2011 | |
| JP | 2012511252 A | 5/2012 | |
| JP | 2015122479 A | 7/2015 | |

* cited by examiner

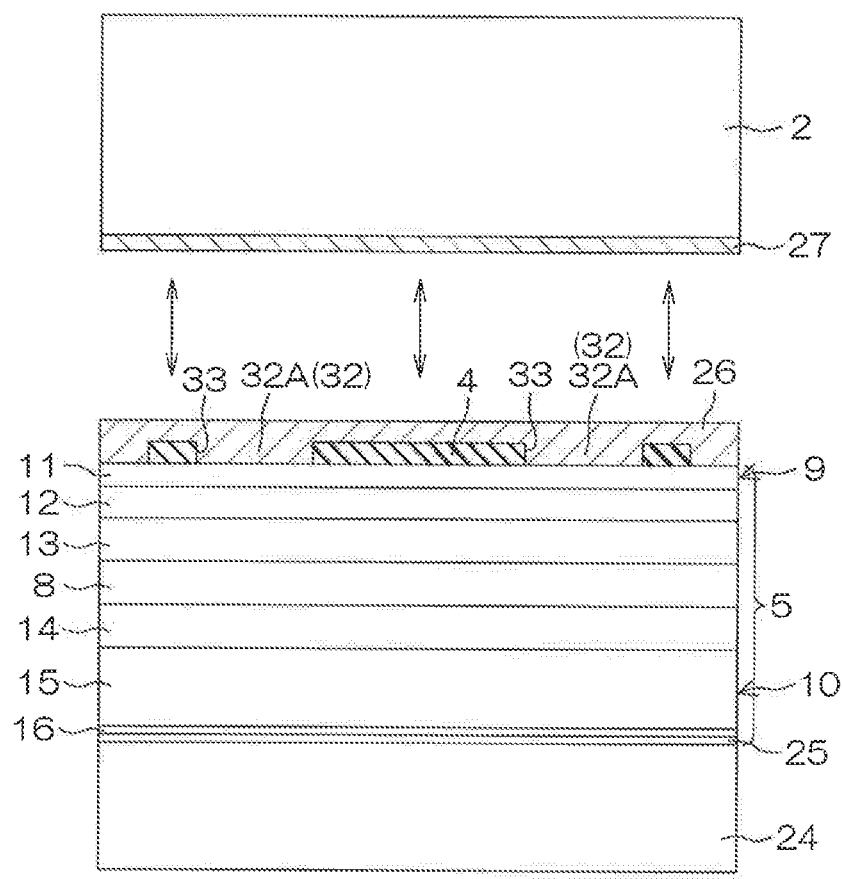

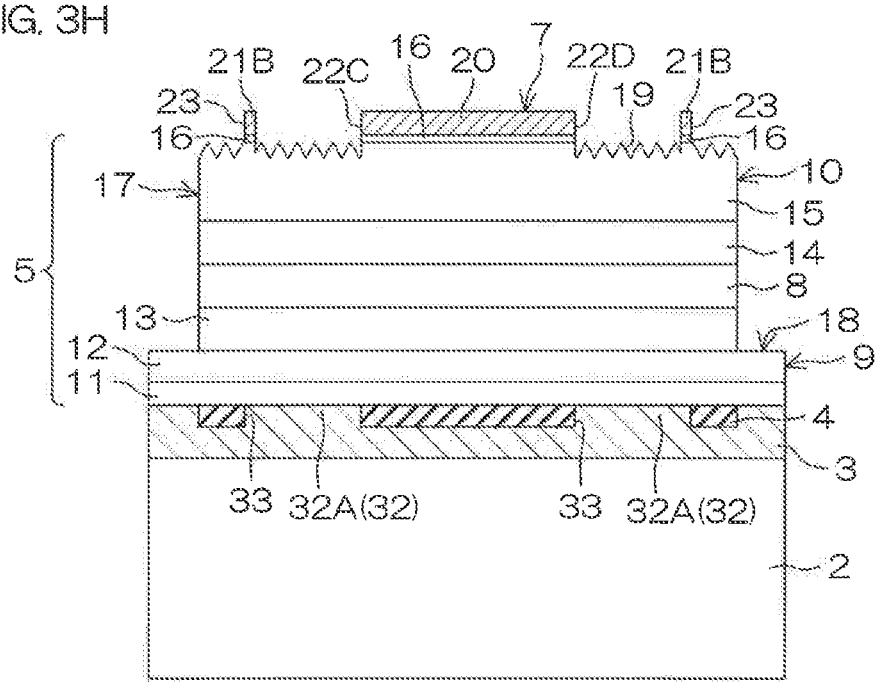
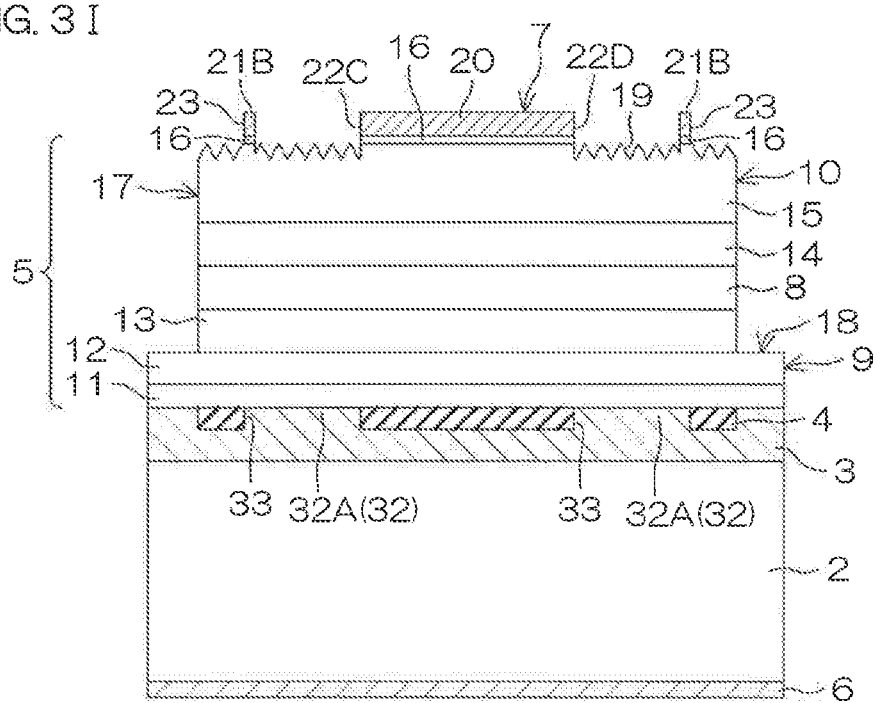

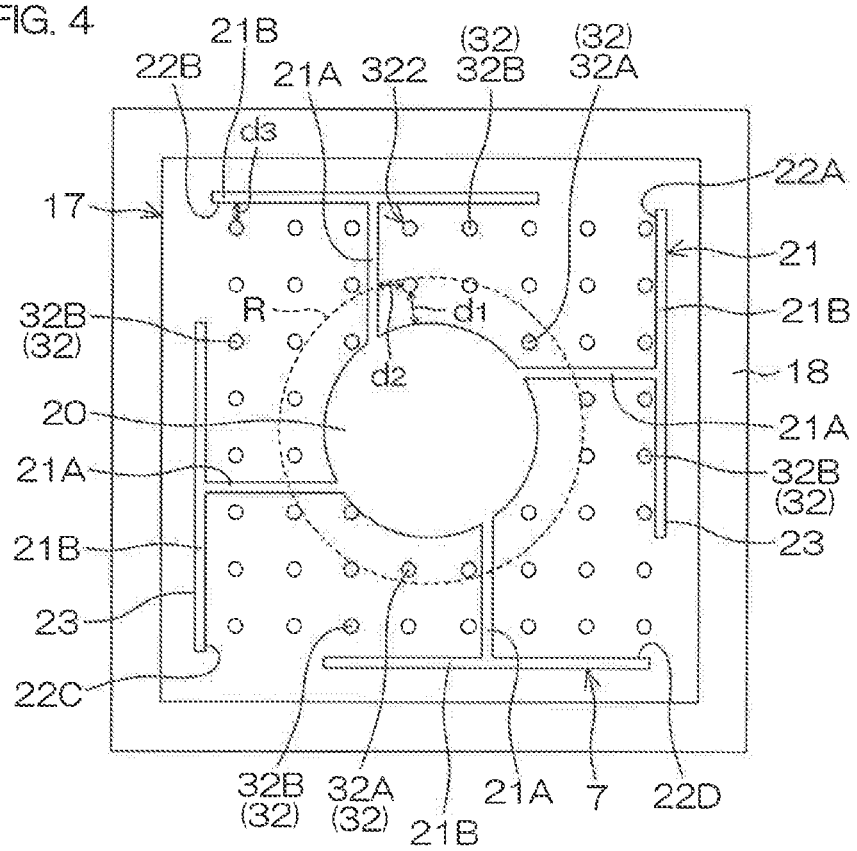

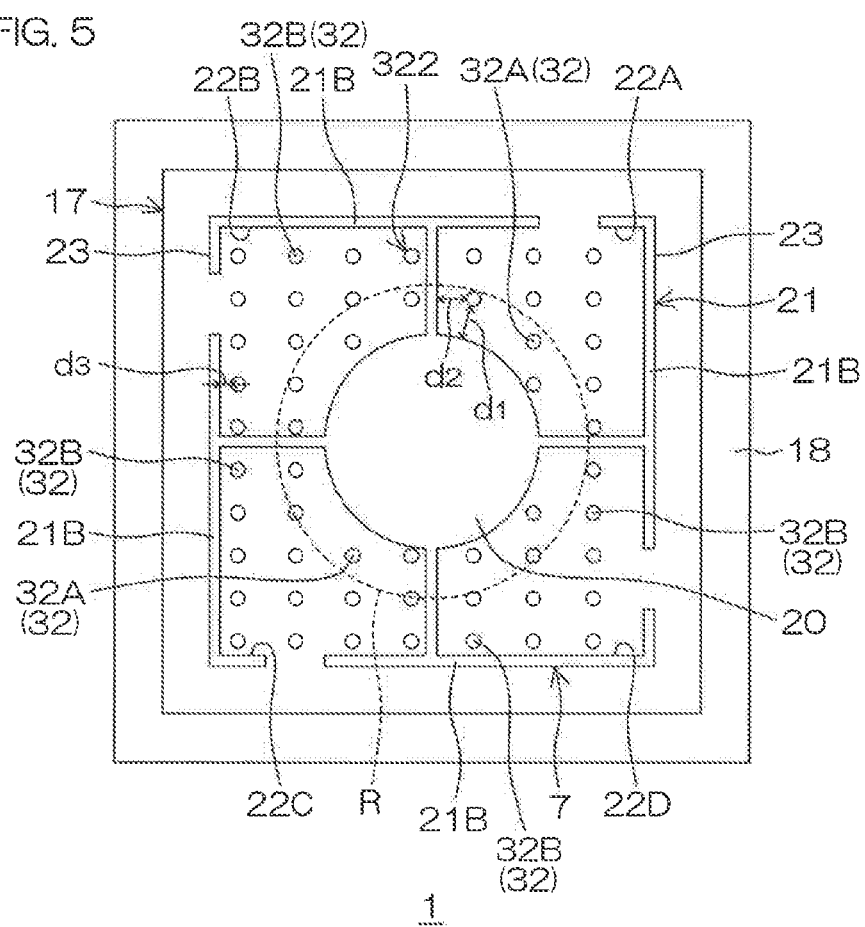

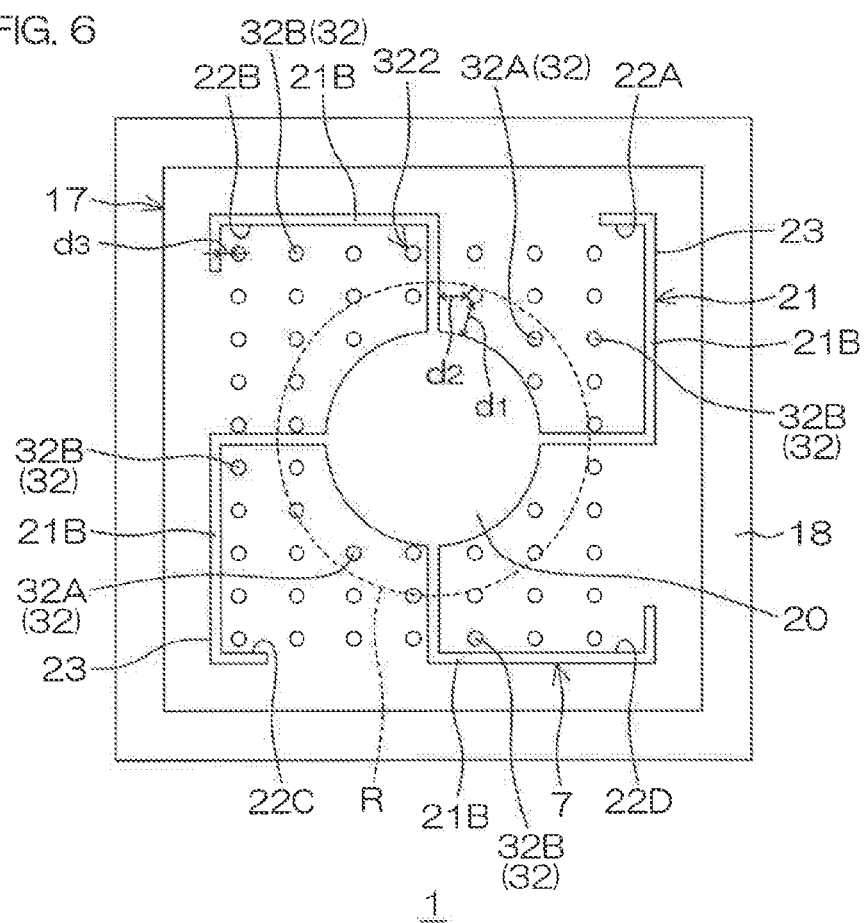

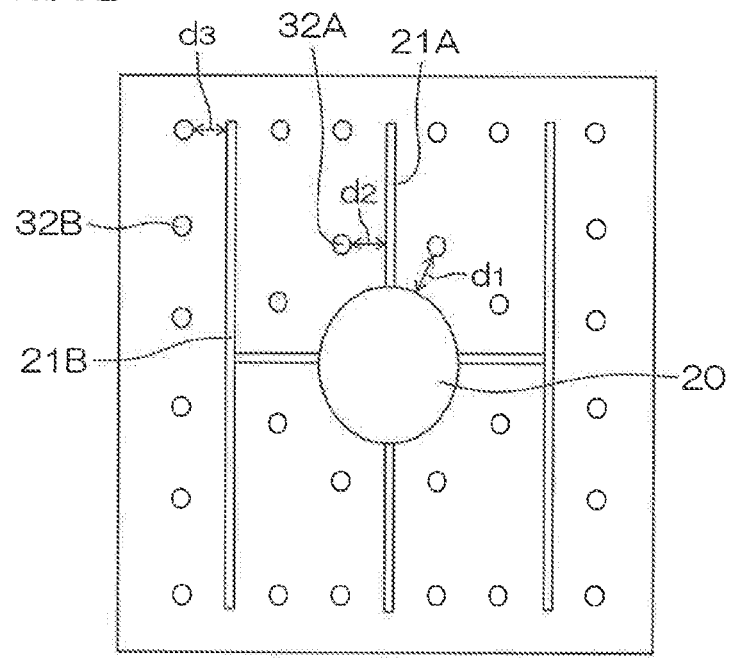
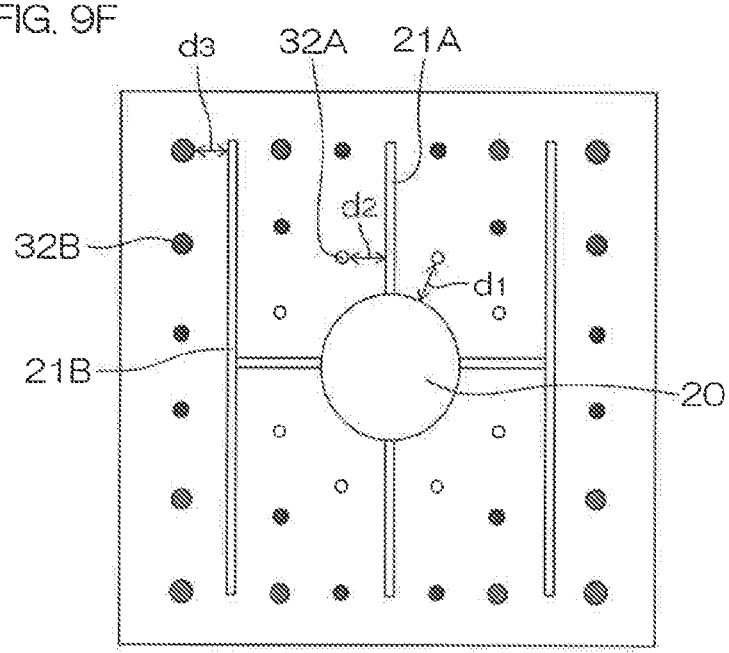

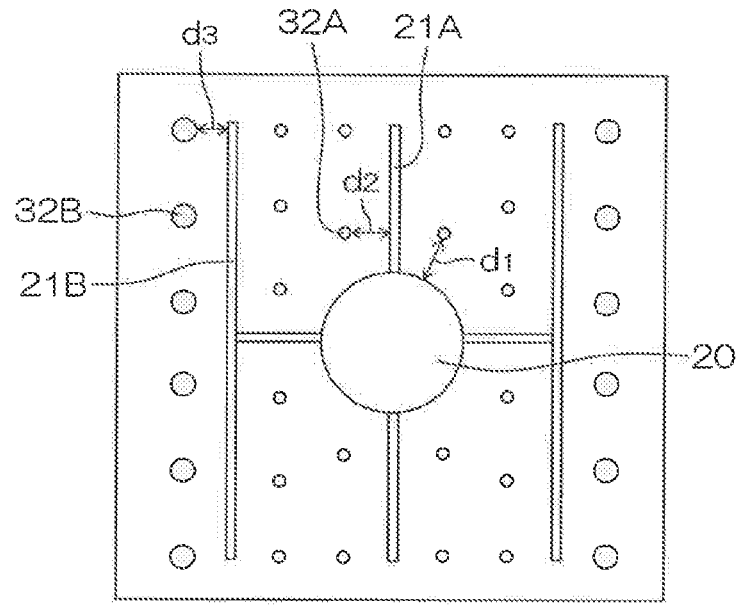
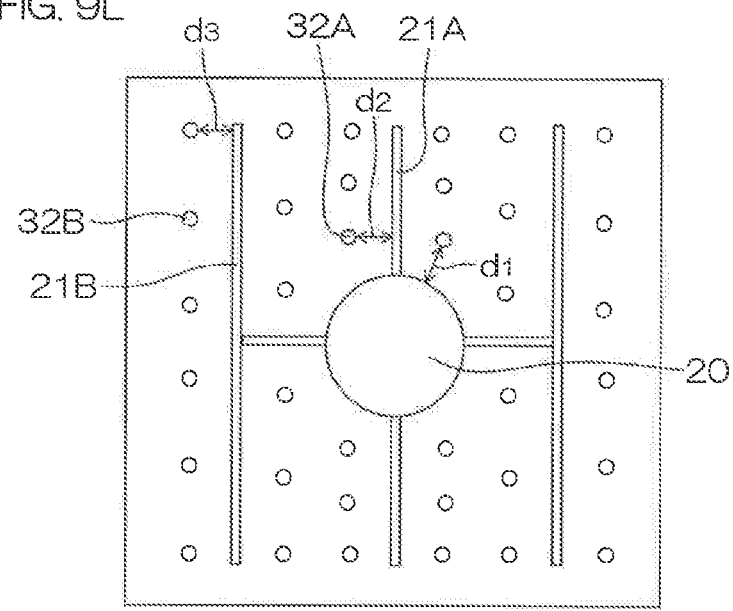

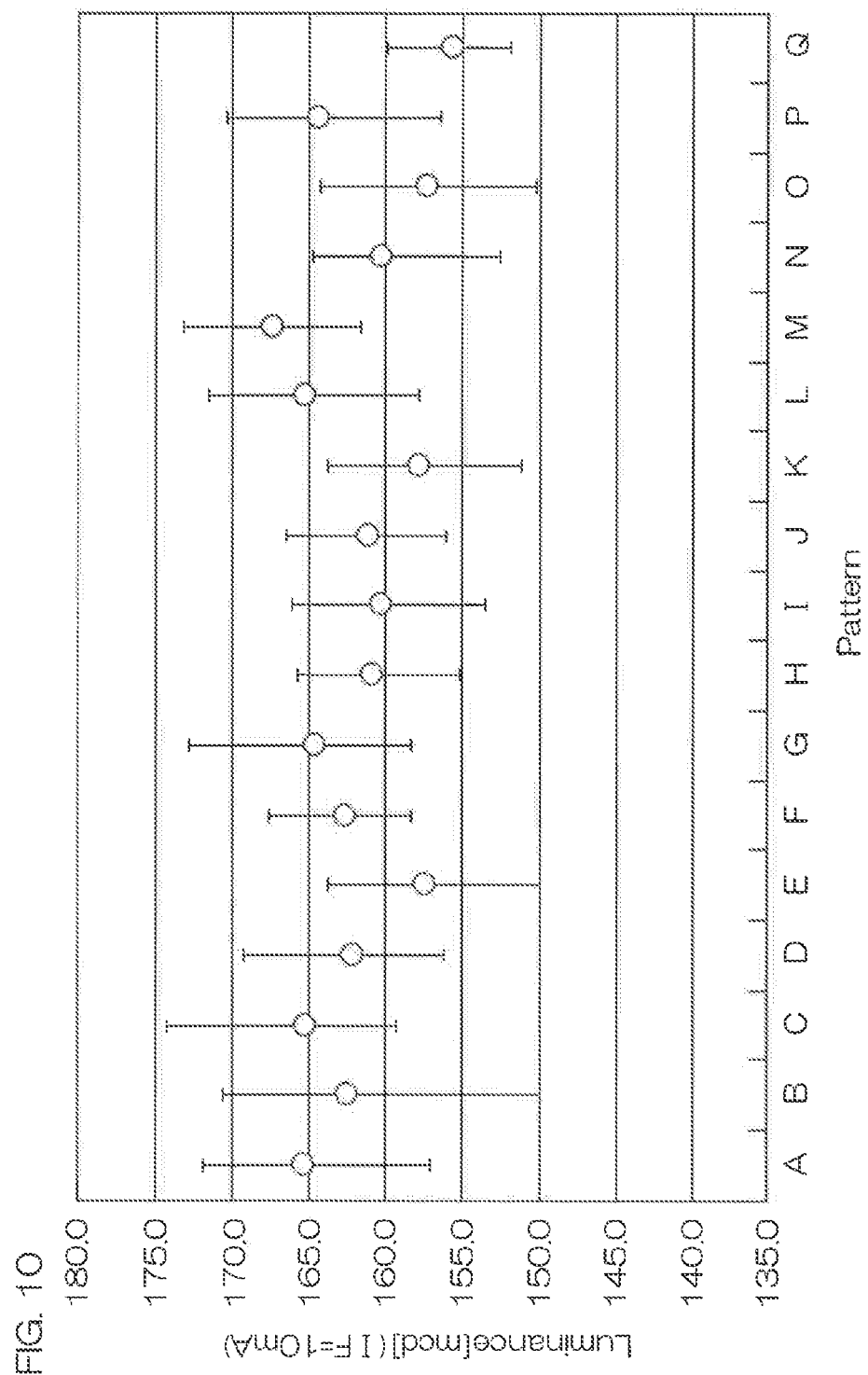

FIG. 12
| Number of ODRs | Without branch | With branch |
|---|---|---|
| 44 | 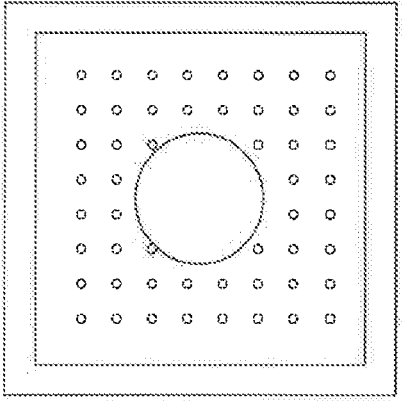 | 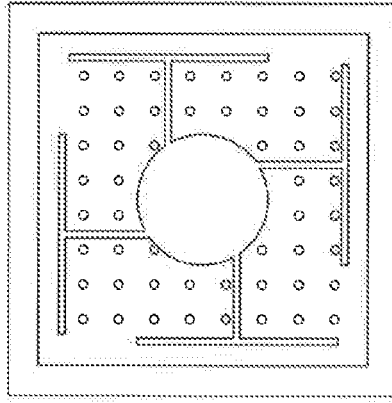 |
| 40 | 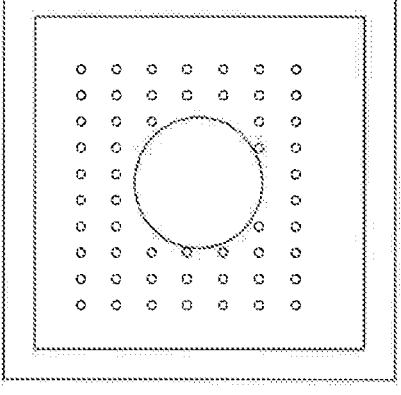 | 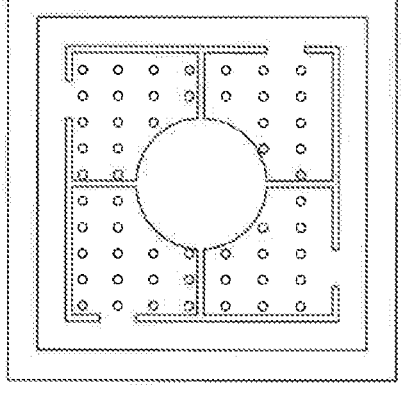 |

SEMICONDUCTOR LIGHT-EMITTING ELEMENT

CROSS-REFERENCE TO RELATED APPLICATIONS

This application corresponds to Patent Application No. 2015-194619 submitted to Japanese Patent Office on Sep. 30, 2015, and the entire contents of this application are hereby incorporated by reference.

TECHNICAL FIELD

The present invention relates to a semiconductor light-emitting element.

BACKGROUND ART

The light-emitting diode disclosed in the patent literature 1 (Japanese Unexamined Patent Application Publication 2007-221029) includes a semiconductor layer composed of an ohmic contact layer, a second metal layer, a first metal layer, an insulating layer, a p-type contact layer, a p-type clad layer, a multiple quantum well (MQW) active layer, an n-type clad layer, and an n-type contact layer laminated on one surface of a support substrate in that order, while employing an omnidirectional reflector (ODR). That is, a contact portion is embedded in part of a region of an insulating layer between the p-type contact layer and the first metal layer, and thereby the first metal layer and the p-type contact layer are electrically connected to each other. A p-side electrode and a ring-shaped n-side electrode are provided on the rear surface of the support substrate and on the n-type contact layer, respectively.

SUMMARY OF THE INVENTION

The invention according to the patent literature 1 aims to improve light extraction efficiency by employing an omni-directional reflector (ODR). However, current is concentrated in part of the ODR depending on the arrangement pattern of the ODR, to thus make it difficult to allow the current to efficiently flow over the entire substrate surfaces. For this reason, a forward voltage (VF) needs to be increased to achieve higher levels of luminance (IV). An object of the present invention is to provide a semiconductor light-emitting element capable of flowing current evenly over a plurality of contact portions even under a low forward voltage (VF).

BRIEF DESCRIPTION OF THE DRAWINGS

FIGS. 3A to 3I are views illustrating manufacturing steps of a semiconductor light-emitting element shown in FIGS. 1 and 2.

FIG. 4 is a plan view illustrating a variation of the light-emitting element shown in FIG. 1.

FIG. 5 is a plan view illustrating a variation of the light-emitting element shown in FIG. 1.

FIG. 6 is a plan view illustrating a variation of the light-emitting element shown in FIG. 1.

FIG. 10 is a view illustrating luminance (IV) of the patterns shown in FIGS. 9A to 9Q.

FIG. 12 is a view illustrating the electrode patterns and the ODR patterns used for the characteristic evaluation.

DESCRIPTION OF EMBODIMENTS

Figure 1:
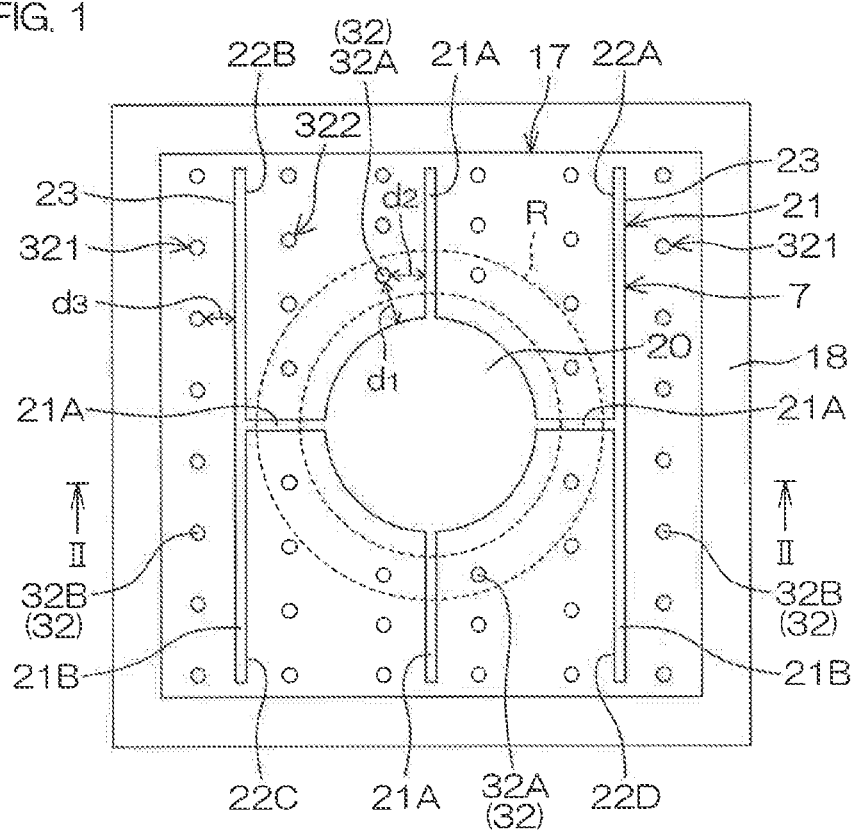
FIG. 1 is a plan view of a semiconductor light-emitting element according to an embodiment of the present invention.

A semiconductor light-emitting element according to an embodiment of the present invention includes: a substrate; a metal layer on the substrate; a semiconductor layer formed on the metal layer, including a light-emitting layer, a first conductivity type layer arranged closer to the substrate than the light-emitting layer, and a second conductivity type layer arranged at the opposite side of the substrate across the light-emitting layer; a plurality of contact portions discretely arranged substantially over the entire substrate surfaces in plan view when viewed from the direction normal to the substrate, the plurality of contact portions electrically connecting the metal layer with the first conductivity type layer; a surface electrode formed on the semiconductor layer, including a pad electrode and a branch-shaped electrode that extends like a branch from the pad electrode between the plurality of contact portions in plan view; and a rear surface electrode on the rear surface of the substrate, and distances between the contact portions and the surface electrode satisfies the following relational expression:

$d_1 > d_2 > d_3$

Where, $d_1$ represents a distance between a first contact portion in the periphery of the pad electrode among the contact portions and the pad electrode; $d_2$ represents a distance between the first contact portion and the branch-shaped electrode closest to the first contact portion; and $d_3$ represents a distance between a second contact portion spaced further away from the pad electrode than the first contact portion among the contact portions and the branch-shaped electrode closest to the second contact portion.

According to the configuration, by decreasing the distance $d_3$, current is allowed to flow reliably in the second contact portion which is far away from the pad electrode and thus makes it relatively difficult for the current to flow. Whereas, in the periphery of the pad electrode, it is possible to distribute current to flow in the branch-shaped electrode in the periphery of the pad electrode without causing concentration of current flow in the pad electrode by positioning the first contact portion closer to the branch-shaped electrode than to the pad electrode so as to satisfy a relational expression: distance $d_1$ > distance $d_2$. This configuration makes it possible to effectively use the plurality of contact portions discretely arranged substantially over the entire substrate surfaces, and therefore current is allowed to flow evenly over the plurality of contact portions even under a low forward voltage (VF). As a result, it is possible to provide a semiconductor light-emitting element capable of achieving higher levels of luminance even under a low forward voltage (VF).

Further, a semiconductor light-emitting element according to an embodiment of the present invention may have the following configuration:

For example, the branch-shaped electrode includes an outer peripheral portion arranged in the peripheral edge of the semiconductor layer and an intermediate portion that connects the outer peripheral portion and the pad electrode, wherein the distance $d_2$ may include a distance between the first contact portion and the intermediate portion, and the distance $d_3$ may include a distance between the second contact portion and the outer peripheral portion.

Further, the semiconductor layer may have a rectangular shape in plan view; the pad electrode may be arranged substantially in the center of the semiconductor layer; and the branch-shaped electrode may extend from the pad electrode toward each of the four end surfaces of the semiconductor layer and further extend along each end surface of the semiconductor layer.

Further, the semiconductor layer may have a rectangular shape in plan view; the pad electrode may be arranged at one corner of the semiconductor layer; and the branch-shaped electrode may extend from the pad electrode along the end surface that extends from the corner of the semiconductor layer where the pad electrode is arranged.

Further, the semiconductor light-emitting element may include an insulating layer between the semiconductor layer and the metal layer; the contact portion may be composed of part of the metal layer, passing through the insulating layer and may be connected to the first conductivity type layer.

The insulating layer may include at least either an $SiO_2$ film or an SiN film.

Further, the diameter of each contact portion may be 8 µm to 15 µm.

Further, the number of the plurality of contact portions may be 28 to 60.

Further, a coverage (contact portion area/light-emitting area) represented by the total area of the plurality of contact portions relative to the light-emitting area of the semiconductor light-emitting element may be 6% to 40%.

Further, the metal layer may contain Au, and the substrate may include a silicon substrate.

Further, the surface of the semiconductor layer may be formed in a fine irregular shape.

Hereinafter, an embodiment according to the present invention will be described in detail with reference to the attached drawings.

Figure 2:
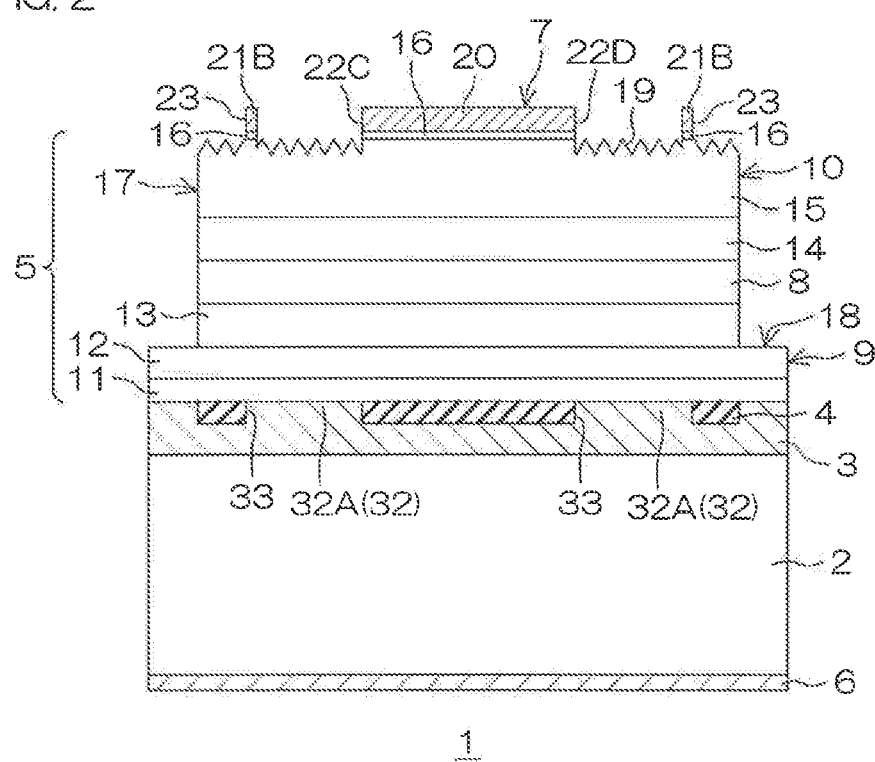
FIG. 2 is a cross-sectional view taken along a line II-II of FIG. 1.

FIG. 1 is a plan view of a semiconductor light-emitting element according to an embodiment of the present invention. FIG. 2 is a cross-sectional view taken along a line II-II of FIG. 1. A scale between elements is partly modified for the sake of clarity in FIGS. 1 and 2.

The semiconductor light-emitting element 1 includes a substrate 2, a metal layer 3 on the substrate 2, an insulating layer 4 on the metal layer 3, a group III nitride semiconductor laminate structure 5 as an example of a semiconductor layer according to the present invention, a p-side electrode 6 (rear surface electrode) formed to make contact with the rear surface of the substrate 2 (surface on the opposite side of the group III nitride semiconductor laminate structure 5), and an n-side electrode 7 (surface electrode) formed to make contact with the surface of the group III nitride semiconductor laminate structure 5.

The substrate 2 is composed of a silicon substrate in this embodiment. Of course, the substrate 2 may be composed of a semiconductor substrate made of gallium arsenide (GaAs), gallium phosphide (GaP) and so forth. Although the substrate 2 has a substantially square shape in plan view, the planar shape of the substrate 2 is not particularly limited, and may have, for example, a substantially rectangular shape in plan view. Further, the thickness of the substrate 2 may be, for example, approximately 150 µm.

The metal layer 3 includes Au or alloys containing Au in this embodiment. The metal layer 3 may be a single layer composed of an Au layer or an Au alloy layer, or may be a multilayer in which these layers and other metal layers are laminated. When the metal layer 3 has a composite laminate structure, the composite laminate structure may be represented by, for example, Au (on the side of the group III nitride semiconductor laminate structure 5) /AuBeNi/Au/Mo/Au/Mo/Au/Ti (on the side of the substrate 2). Further, the metal layer 3 may be configured such that, for example, a plurality of metal materials is sequentially distributed from the substrate 2 side without forming clear boundaries between the plurality of metal materials that compose the metal layer 3. Meanwhile, according to this embodiment, the metal layer 3 is formed by joining a first metal layer 26 (described later) and a second metal layer 27 (described later) while bonding a growth substrate 24 (described later) and the substrate 2, as described later. Accordingly, a boundary due to a bonding surface that is created during the bonding process may exist at a midway position in the thickness direction of the Au layer composing the metal layer 3.

The metal layer 3 is formed to cover the entire surface of the substrate 2. Further, the total thickness of the metal layer 3 may be, for example, approximately 0.5 µm.

The insulating layer 4 may be composed of a $SiO_2$ film or a SiN film. A contact hole 33 is formed in the insulating layer 4 to selectively expose the lower surface of the group III nitride semiconductor laminate structure 5, to thus allow part of the metal layer 3 to be embedded in this contact hole 33 as a contact portion 32. The contact portion 32 is connected to the group III nitride semiconductor laminate structure 5. Thereby, an omnidirectional reflector (ODR) is formed in the semiconductor light-emitting element 1.

The group III nitride semiconductor laminate structure 5 includes a light-emitting layer 8, a p-type semiconductor layer 9, and an n-type semiconductor layer 10. The p-type semiconductor layer 9 is arranged closer to the substrate 2 than the light-emitting layer 8, and the n-type semiconductor layer 10 is arranged closer to the n-side electrode 7 than the light-emitting layer 8. In this way, a double hetero junction is formed with the light-emitting layer 8 interposed between the p-type semiconductor layer 9 and the n-type semiconductor layer 10. Electrons are injected from the n-type semiconductor layer 10 and holes are injected from the p-type semiconductor layer 9 into the light-emitting layer 8. The holes and the electrons are recombined in the light-emitting layer 8 to thereby generate light.

The p-type semiconductor layer 9 is composed of a p-type Gallium phosphide (GaP) contact layer 11 (for example, with thickness of 0.3 µm), a p-type GaP window layer 12 (for example, with thickness of 1.0 µm), and a p-type AlInP clad layer 13 (for example, with thickness of 0.8 µm), laminated in that order from the substrate 2. Whereas, the n-type semiconductor layer 10 is composed of an n-type AlInP clad layer 14 (for example, with thickness of 0.8 µm), an n-type AlInGaP window layer 15 (for example, with thickness of 1.8 µm), and an n-type GaAs contact layer 16 (for example, with thickness of 0.3 µm), laminated in that order on the light-emitting layer 8.

The p-type Gallium phosphide (GaP) contact layer 11 is made into a p-type semiconductor by doping GaP with, for example, carbon (C) as a p-type dopant at high concentrations (doping concentration is, for example, $1.8 \times 10^{19}$ cm$^{-3}$). Whereas, the n-type gallium arsenide (GaAs) contact layer 16 is made into an n-type semiconductor layer by doping GaAs with, for example, silicon (Si) as an n-type dopant at high concentrations (doping concentration is, for example, $2.0 \times 10^{18}$ cm$^{-3}$).

The p-type GaP window layer 12 is made into a p-type semiconductor by doping GaP with, for example, magnesium (Mg) as a p-type dopant (doping concentration is, for example, $2.1 \times 10^{18}$ cm$^{-3}$). Whereas, the n-type AlInGaP window layer 15 is made into an n-type semiconductor layer by doping AlInGaP with, for example, silicon (Si) as an n-type dopant (doping concentration is, for example, $1.0 \times 10^{18}$ cm$^{-3}$).

The p-type AlInP clad layer 13 made into a p-type semiconductor by doping AlInP with, for example, magnesium (Mg) as a p-type dopant (doping concentration is, for example, $6.0 \times 10^{16}$ cm$^{-3}$). Whereas, the n-type AlInP clad layer 14 is made into an n-type semiconductor layer by doping AlInP with, for example, silicon (Si) as an n-type dopant (doping concentration is, for example, $3.0 \times 10^{17}$ cm$^{-3}$).

The light-emitting layer 8 includes a multiple quantum well (MQW) structure (multi-quantum well structure) containing, for example, InGAP, where electrons and holes are recombined to thereby generate light and the generated light is boosted.

The light-emitting layer 8 includes a multiple quantum well (MQW) structure (multi-quantum well structure) configured by alternately and repeatedly laminating a plurality of times a quantum well layer (with thickness of, for example, 5 nm) composed of InGaP layer and a barrier layer (with thickness of, for example, 4 nm) composed of AlInGaP layer. In this case, the quantum well layer composed of InGaP has a relatively small band gap with a composition ratio of indium (In) greater than 5%, while the barrier layer composed of AlInGaP has a relatively large band gap. For example, the quantum well layer (InGaP) and the barrier layer (AlInGaP) are alternately and repeatedly laminated two to seven cycles, and thereby the light-emitting layer 8 is configured to have a multi-quantum well structure. The light-emitting wavelength corresponds to the band gap of the quantum well layer, and the adjustment of band gap can be carried out by adjusting the composition ratio of indium (In). The greater the composition ratio of indium (In), the smaller the band gap, and thus the light-emitting wavelength is increased. According to this embodiment, the light-emitting wavelength is set to 610 nm to 630 nm (for example 625 nm) by adjusting the composition ratio of indium (In) in the quantum well layer (InGaP layer).

As shown in FIGS. 1 and 2, a mesa portion 17 is formed by removing part of the group III nitride semiconductor laminate structure 5. More specifically, part of the n-type semiconductor layer 10, the light-emitting layer 8, and the p-type semiconductor layer 9 are removed by etching from the surface of the group III nitride semiconductor laminate structure 5 along the entire circumference of the group III nitride semiconductor laminate structure 5 to thereby form the mesa portion 17 with a substantially rectangular shape in cross-sectional view. The shape of the mesa portion 17 is not limited to a rectangular shape in cross-sectional view, but may be a trapezoidal shape in cross-sectional view. Further the mesa portion 17 has a substantially rectangular shape in plan view. Thereby, the p-type GaP window layer 12 and the layers closer to the substrate 2 than the p-type GaP window layer 12 constitute a drawn portion 18 that is drawn in the lateral direction from the mesa portion 17. As shown in FIG. 1, the mesa portion 17 is surrounded by the drawn portion 18 in plan view.

A fine irregular shape 19 is formed on the surface of the mesa portion 17. With this fine irregular shape 19, the light picked up from the group III nitride semiconductor laminate structure 5 can be diffused. According to this embodiment, the n-type GaAs contact layer 16 is selectively removed so as to match the shape of the n-side electrode 7, and thereby the n-type AlInGaP window layer 15 is exposed so that the fine irregular shape 19 is formed on the exposed surface, as described later. The fine irregular shape 19 is not shown in FIG. 1 for the sake of clarity.

The p-side electrode 6 as a rear surface electrode is composed of Au or Au alloys in this embodiment. Specifically, a laminate structure represented by Ti (on the side of the substrate 2)/Au/Mo/Au may be employed. Further, the p-side electrode 6 is formed to cover the entire rear surface of the substrate 2.

The n-side electrode 7 as a surface electrode composed of Au or Au alloys in this embodiment. Specifically, a laminate structure represented by Au (on the side of the group III nitride semiconductor laminate structure 5)/Ge/Ni/Au may be employed.

Further, the n-side electrode 7 integrally includes a pad electrode 20 and a branch-shaped electrode 21 that selectively extends like a branch from the pad electrode 20 so as to partition prescribed regions in the periphery of the pad electrode 20.

According to this embodiment, the pad electrode 20 is disposed substantially in the center of the mesa portion 17 in plan view, and the branch-shaped electrode 21 is formed so as to partition surrounded regions 22A, 22B, 22C, 22D between the pad electrode 20 and each of the four corners of the mesa portion 17. Each surrounded region 22A, 22B, 22C, 22D is surrounded by an intermediate portion 21A of the branch-shaped electrode 21 extending from the pad electrode 20 toward each peripheral edge (or end surface) of the mesa portion 17 so as to form a cross shape, an outer peripheral portion 21B of the branch-shaped electrode 21 intersecting with the cross-shaped intermediate portion 21A and extending along a pair of peripheral edge (or end surface) of the mesa portion 17 opposite each other, and the pad electrode 20. Meanwhile, a region outside the outer peripheral portion 21B excluding the surrounded regions 22A, 22B, 22C, 22D is defined as an outer peripheral region 23 of the mesa portion 17.

According to this embodiment, since the n-type GaAs contact layer 16 has the same shape as the n-side electrode 7, the n-type AlInGaP window layer 15 is exposed from the surrounded regions 22A, 22B, 22C, 22D and the outer peripheral region 23.

As shown in FIG. 1, the contact portions 32 of the metal layer 3 are discretely arranged over the surface of the substrate 2. The contact portions 32 may be arranged, for example, in a matrix in the mesa portion 17 having a rectangular shape in plan view.

According to this embodiment, each outside row 321 composed of a plurality of contact portions 32 is provided in each outer peripheral region 23 outside a pair of the outer peripheral portion 21B. The contact portions 32 in each outside row 321 are arrayed along the outer peripheral portion 21B at a constant distance therefrom.

An inside row 322 composed of a plurality of contact portions 32 is provided in the surrounded regions 22A to 22D inside the pair of outer peripheral portions 21B. For example, a plurality of inside rows 322 is provided parallel to the outside row 321. In this embodiment, two rows are formed to extend over the surrounded regions 22A and 22D, while two rows are formed to extend over the surrounded regions 22B and 22C.

Next, the following description will apply to the plurality of contact portions 32:

The diameter of each contact portion 32 is, for example, 8 μm to 15 μm. Further, the total number of the plurality of contact portions 32 is, for example, 28 to 60. According to this embodiment, 44 contact portions are formed. A coverage (area of contact portions 32/light-emitting area) represented by the total area of the plurality of contact portions 32 (the diameter of each contact portion 32×the number of contact portions 32) to the light-emitting area (the surface area of the mesa portion 17 in this embodiment) of the semiconductor light-emitting element 1 is, for example, 6% to 40%.

Further, distances $d_1$, $d_2$ and $d_3$ as described below satisfies the following relational expression:

$$d_1 > d_2 > d_3$$

Where, $d_1$ represents a distance between the pad electrode 20 and a contact portion 32A (contact portion 32 within a region R surrounded by a dash line shown in FIG. 1) as an example of a first contact portion according to the present invention in the periphery of the pad electrode 20 among the contact portions in the inside row 322; $d_2$ represents a distance between the contact portion 32A and the intermediate portion 21A; and $d_3$ represents a distance between the outer peripheral portion 21B and a contact portion 32B as an example of a second contact portion according to the present invention in the outside row 321.

FIGS. 3A to 3I are views illustrating manufacturing steps of a semiconductor light-emitting element 1 shown in FIGS. 1 and 2 in the order of steps.

Figure 3A:
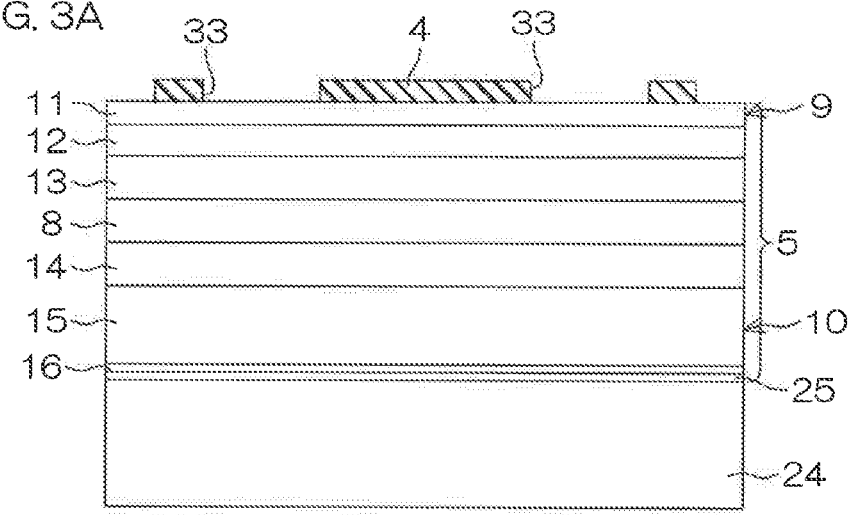

In manufacturing the semiconductor light-emitting element 1, for example as shown in FIG. 3A, the group III nitride semiconductor laminate structure 5 is formed on the growth substrate 24 composed of GaAs and so forth by epitaxial growth. A publicly known growth method such as a molecular beam epitaxial growth method and a metal organic chemical vapor deposition method may apply to the growth method. At this stage, the group III nitride semiconductor laminate structure 5 includes an n-type AlInGaP etching stop layer 25, the n-type GaAs contact layer 16, the n-type AlInGaP window layer 15, the n-type AlInP clad layer 14, the light-emitting layer 8, the p-type AlInP clad layer 13, the p-type GaP window layer 12, and the p-type GaP contact layer 11 in this order from the growth substrate 24. After the group III nitride semiconductor laminate structure 5 is formed, the insulating layer 4 is formed by, for example, CVD method.

Figure 3B:
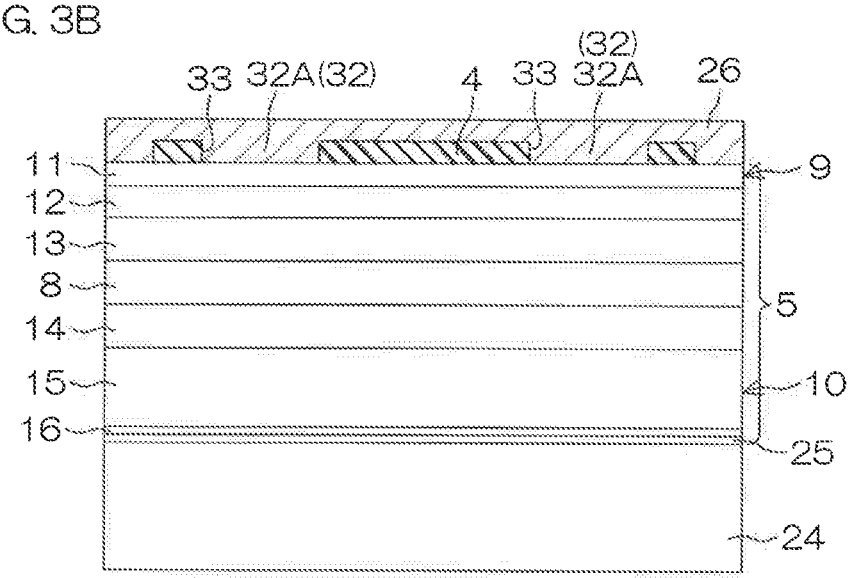

Next, as shown in FIG. 3B, the first metal layer 26 (with a thickness of, for example, 1.7 μm) is formed on the insulating layer 4 by, for example, evaporation method. The first metal layer 26 is composed of Au or Au alloys, and at least the outermost surface is composed of an Au layer. Part of the first metal layer 26 gets into the contact hole 33 as the contact portion 32 and is connected to the p-type GaP contact layer 11.

Next is a bonding step between the growth substrate 24 and the substrate 2. In the bonding step, the first metal layer 26 on the growth substrate 24 and a second metal layer 27 on the substrate 2 are joined to each other. The second metal layer 27 is composed of Au or Au alloys, and at least the outermost surface is composed of an Au layer. The second metal layer 27 is formed on the surface of the substrate 2 (a surface opposite to the surface on which the previously described p-side electrode 6 is formed) by, for example, evaporation method before bonding is carried out.

Figure 3D:
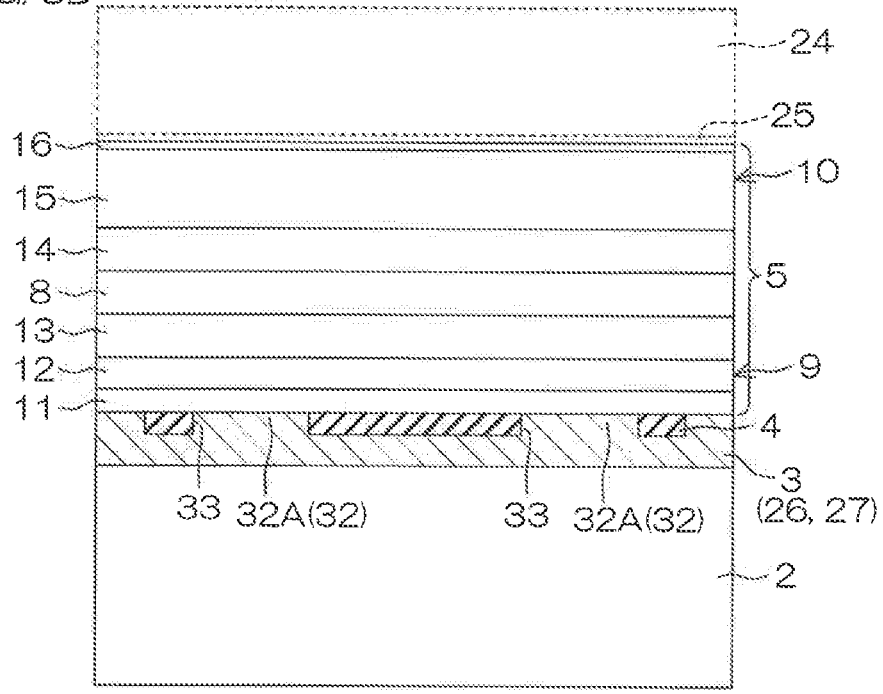

More specifically, as shown in FIG. 3C, the growth substrate 24 and the substrate 2 are laminated with both first and second metal layers 26, 27 facing each other, to thus join the first and second metal layers 26, 27. The first and second metal layers 26, 27 may be joined by, for example, thermocompressing bonding. The thermocompressing bonding may be carried out under the condition that temperature is 250° C. to 700° C., preferably approximately 300° C. to 400° C., and pressure is 10 MPa to 20 MPa. As shown in FIG. 3D, the first and second metal layers 26, 27 are joined by the thermocompressing bonding so that the metal layer 3 is formed.

Next, as shown in FIG. 3D, the growth substrate 24 is removed by, for example, wet etching. Here, since the n-type AlInGaP etching stop layer 25 is formed on the outermost surface of the group III nitride semiconductor laminate structure 5, the wet etching will not have any effect on the n-type GaAs contact layer 16, the n-type AlInGaP window layer 15 and so forth, which contribute to the characteristics of the semiconductor light-emitting element 1. Thereafter, the n-type AlInGaP etching stop layer 25 is also removed.

Figure 3E:
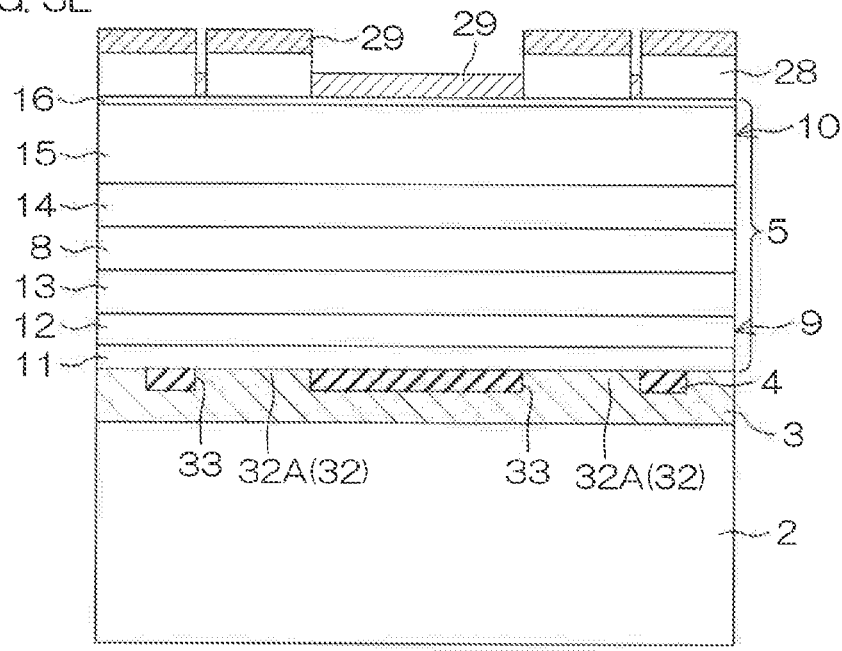

Next is a step of forming the n-side electrode 7. The n-side electrode 7 is formed by using lift-off technology according to this embodiment. More specifically, as shown in FIG. 3E, first, a resist 28 having openings of the same pattern as the electrode pattern of the n-side electrode 7 is formed on the n-type GaAs contact layer 16. Then, an electrode material film 29 is laminated on the group III nitride semiconductor laminate structure 5 by, for example, evaporation method.

Figure 3F:
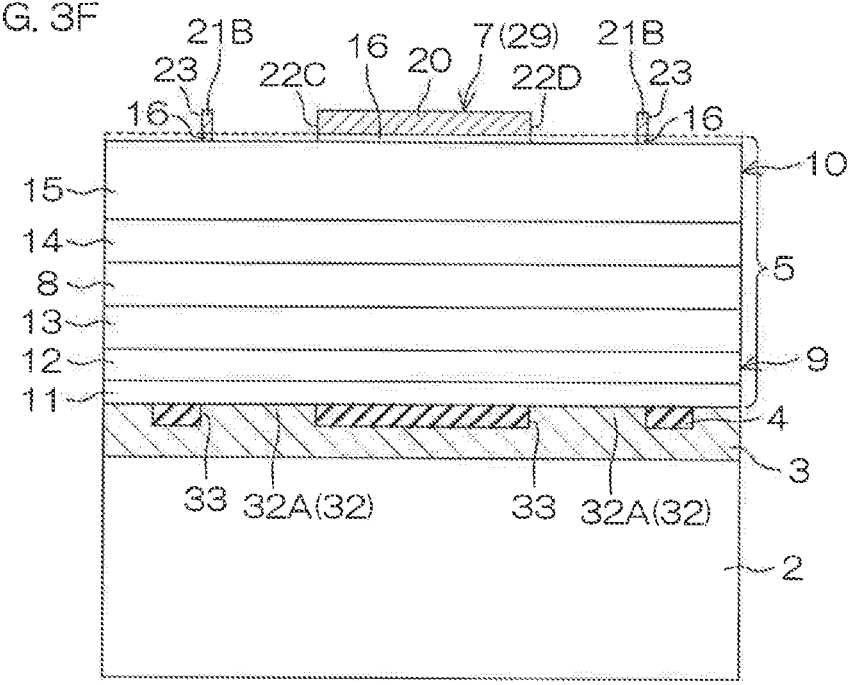

Next, as shown in FIG. 3F, the electrode material film 29 on the resist 28 is removed together with the resist 28. Thereby, the n-side electrode 7 composed of the electrode material film 29, which remains on the n-type GaAs contact layer 16, is formed. Thereafter, a part of the n-type GaAs contact layer 16 exposed from the n-side electrode 7 is removed by etching. Consequently, the n-type AlInGaP window layer 15 is exposed at the portions excluding the n-side electrode 7.

Figure 3G:
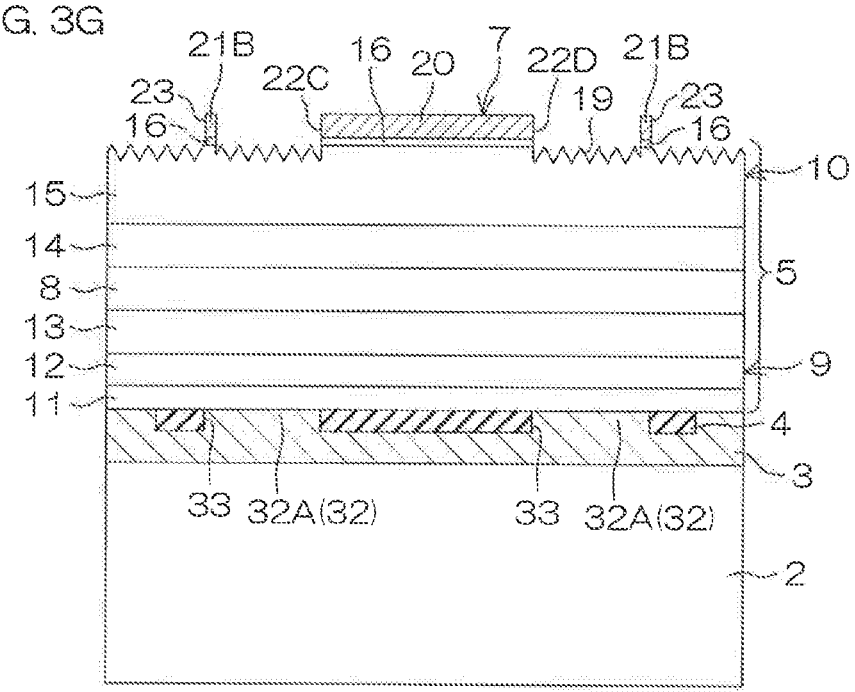

Next, as shown in FIG. 3G, the fine irregular shape 19 is formed on the surface of the n-type AlInGaP window layer 15 by, for example, frosting (wet etching). The frosting may be carried out by dry etching.

Next, as shown in FIG. 3H, the mesa portion 17 and the drawn portion 18 are formed by selectively removing the peripheral edge portions of the group III nitride semiconductor laminate structure 5. The formation of the mesa portion 17 and the drawn portion 18 may be carried out by, for example, wet etching.

Next, as shown in FIG. 3I, the p-side electrode 6 is formed on the rear surface of the substrate 2 by, for example, evaporation method. The semiconductor light-emitting element 1 can be obtained by carrying out the steps as described above.

According to the semiconductor light-emitting element 1, the distance $d_3$ between the outer peripheral portion 21B of the branch-shaped electrode 21 and the contact portion 32B in the outside row 321 adjacent to the outer peripheral portion 21B is minimized as shown in FIG. 1. The outer peripheral portion 21B is farthest away from the pad electrode 20, and therefore makes it more difficult for the current to flow than the pad electrode 20 or the intermediate portion 21A directly connected to the pad electrode 20. However, it is possible to flow the current reliably even in the contact portion 32B by decreasing the distance $d_3$ as previously described. Whereas, in the periphery of the pad electrode 20, it is possible to distribute current to flow in the branch-shaped electrode 21 (intermediate portion 21A) in the periphery of the pad electrode 20 without causing concentration of current flow in the pad electrode 20 by positioning the contact portion 32A closer to the intermediate portion 21A of the branch-shaped electrode 21 than to the pad electrode 20 so as to satisfy a relational expression: distance $d_1$>distance $d_2$. This configuration makes it possible to effectively use the plurality of contact portions 32 discretely arranged substantially over the entire surfaces of the substrate 2, and therefore the current is allowed to flow evenly over the plurality of the contact portions 32 even under a low forward voltage (VF). As a result, it is possible to provide the semiconductor light-emitting element 1 capable of achieving higher levels of luminance even under a low forward voltage (VF).

Although embodiments according to the present invention are described as above, the present invention may also be practiced by other embodiments. For example, the pattern of the n-side electrode 7 and the arrangement pattern of the contact portions 32 are not limited to the example as shown in FIG. 1, but may be those as shown in FIGS. 4 to 8. Also, it should be noted that there exist some cases where a relationship among the distances $d_1$, $d_2$, and $d_3$ are not shown in the drawing so as to satisfy the relational expression: $d_1$>$d_2$>$d_3$.

For example, as shown in FIGS. 4 to 6, the outer peripheral portions 21B of the branch-shaped electrode 21 may be connected to each of the intermediate portions 21A of the branch-shaped electrode 21 extending in four directions from the central pad electrode 20 toward each peripheral edge (or end surface), and may be formed along each peripheral edge (or end surface) of the mesa portion 17. In this case, four substantially T-shaped branch-shaped electrodes 21 (intermediate portion 21A plus outer peripheral portion 21B) may be connected to the central pad electrode 20 as shown in FIGS. 4 and 5, or the branch-shaped electrodes 21 may extend in four directions from the central pad electrode 20 toward each peripheral edge (or end surface) and further extend along each peripheral edge (or end surface) after being bent so as to form a fylfot shape as a whole, as shown in FIG. 6.

In the case described above, the plurality of contact portions 32 may be composed of only the inside row 322 formed in the surrounded regions 22A to 22D without being formed in the outer peripheral region 23. But, of course, the plurality of contact portions 32 may be formed in the outer peripheral region 23.

Figure 7:
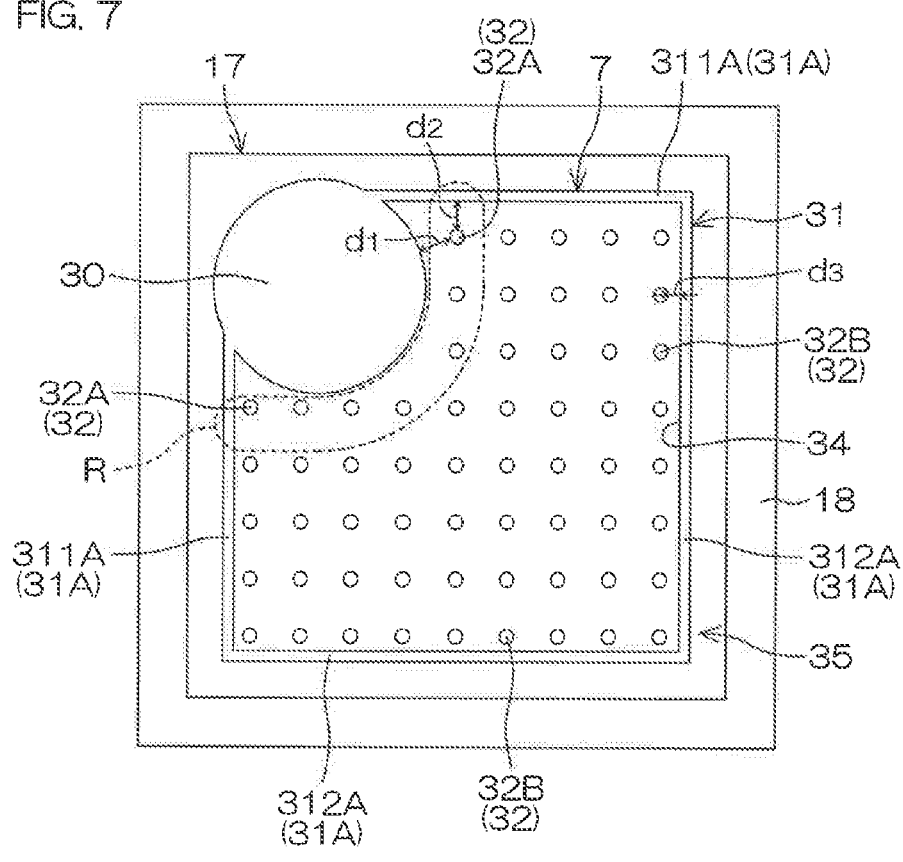
FIG. 7 is a line graph illustrating a relationship between a load applied to a semiconductor chip and an amount of shrunk solder.
Figure 8:
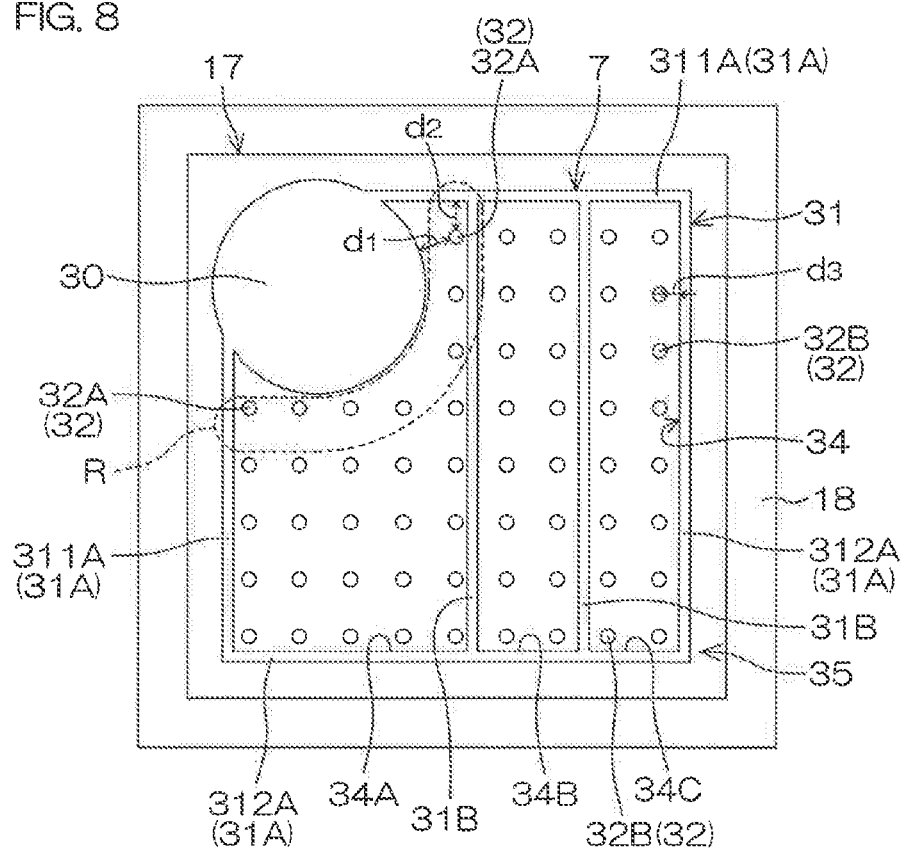
FIG. 8 is a plan view illustrating a variation of the light-emitting element shown in FIG. 1.

Further, as shown in FIGS. 7 and 8, the semiconductor light-emitting element 1 is provided with a pad electrode 30 arranged at one corner of the mesa portion 17 and a branch-shaped electrode 31 extending from the pad electrode 30 along the peripheral edge (or end surface) of the mesa portion 17. The branch-shaped electrode 31 may include an outer peripheral portion 31A formed along the entire circumference of the peripheral edge of the mesa portion 17. A surrounded region 34 may be partitioned by and positioned inside the outer peripheral portion 31A, and an outer peripheral region 35 may be positioned outside the outer peripheral portion 31A. Further, the branch-shaped electrode 31 may include a frame portion 31B for dividing the surrounded region 34 into a plurality of surrounded regions 34A, 34B, and 34C as shown in FIG. 8.

According to this embodiment, the outer peripheral portion 31A is formed into a rectangular shape in plan view, composed of four sides along the peripheral edges of the mesa portion 17, and includes a first portion 311A directly connected to the pad electrode 30 and further a second portion 312A extending from the opposing corner of the pad electrode 30. In this case, the contact portion 32B as an example of the second contact portion according to the present invention may be a contact portion 32 arrayed along, for example, the second portion 312A. Although the contact portions 32A, 32B are formed only in the surrounded region 34 in FIGS. 7 and 8, these portions may be formed in the outer peripheral region 35.

It is to be understood that variations and modifications can be made without departing from the scope and spirit of the present invention.

EMBODIMENT

Hereinafter, the present invention will be described on the basis of the following embodiments, but it is to be understood that the present invention is not limited to the following embodiments.

(1) Measurement of Luminance (IV) and Forward Voltage (VF)

Figure 9A:
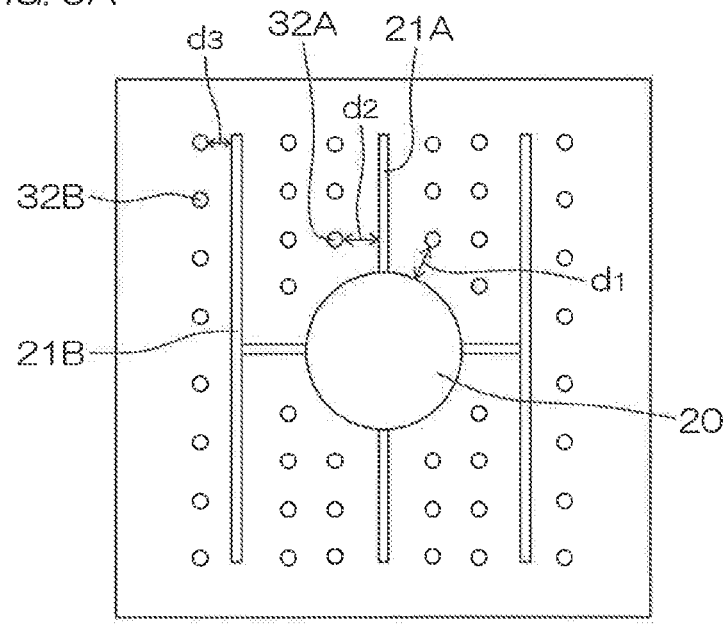
FIGS. 9A to 9Q are views illustrating patterns of ODRs used for characteristic evaluation.
Figure 9B:
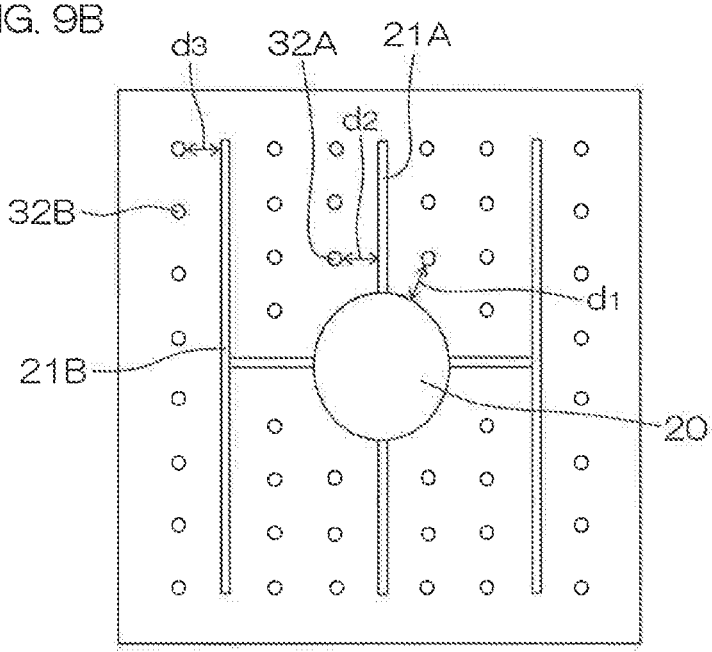
Figure 9C:
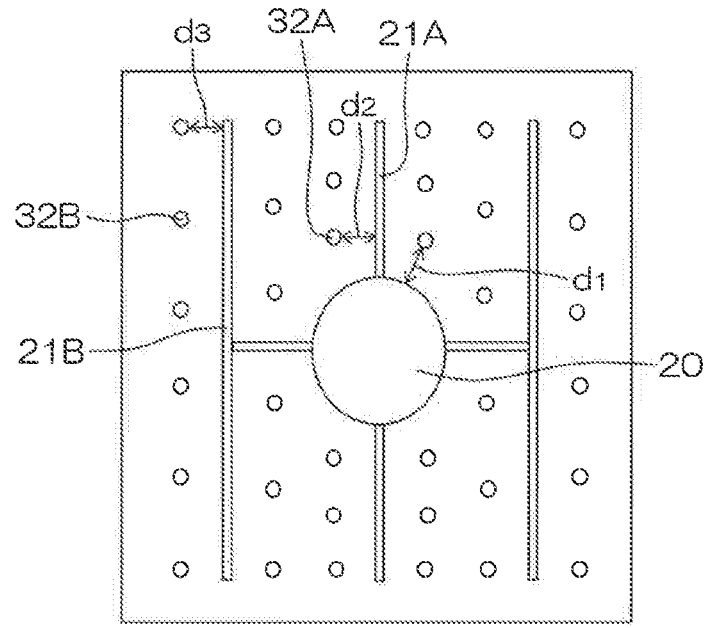
Figure 9D:
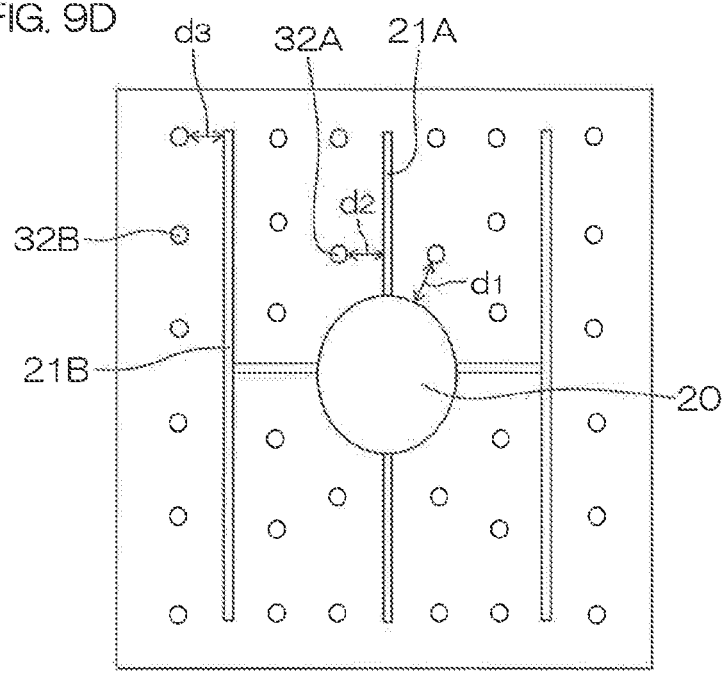
Figure 9G:
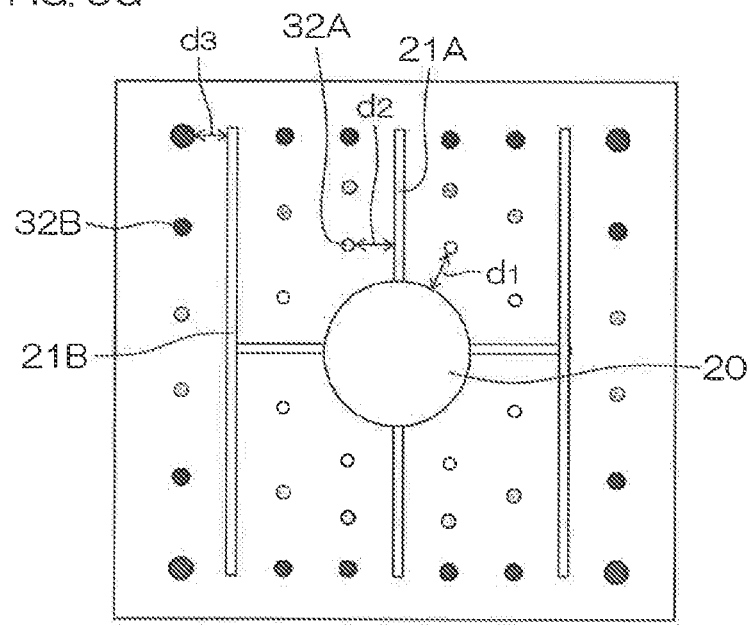
Figure 9H:
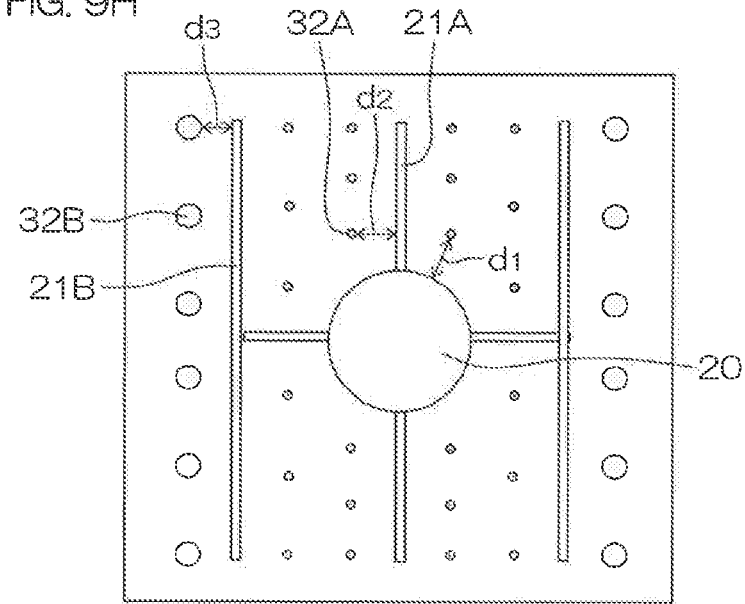
Figure 9:
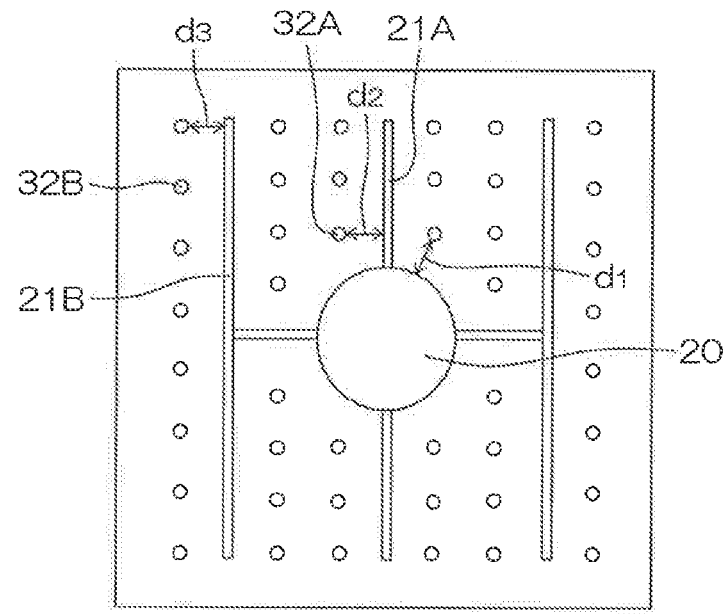
Figure 9:
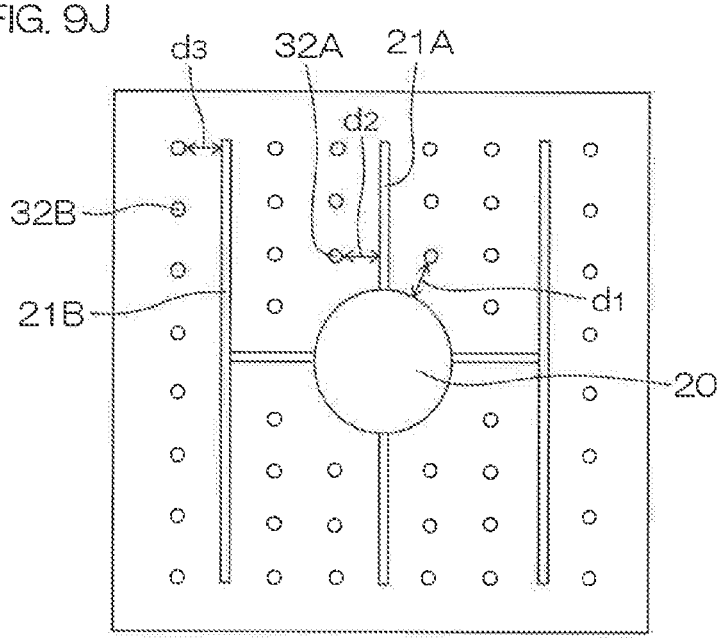
Figure 9M:
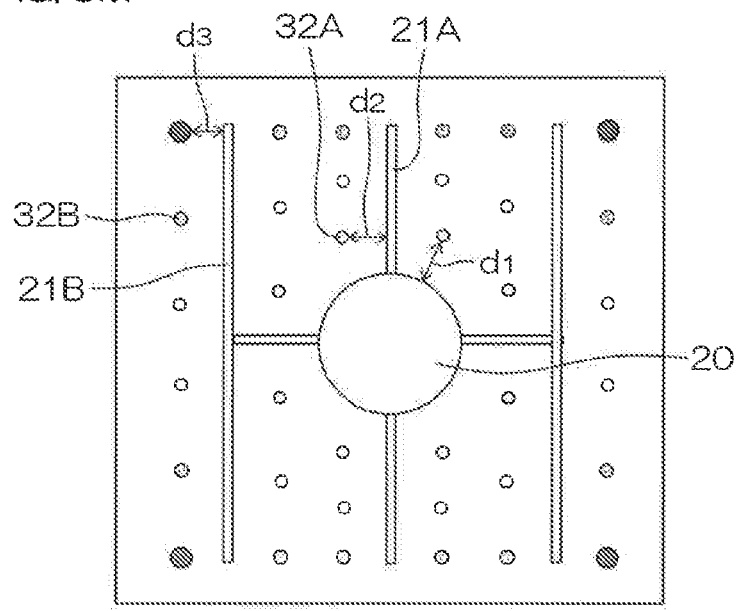
Figure 9N:
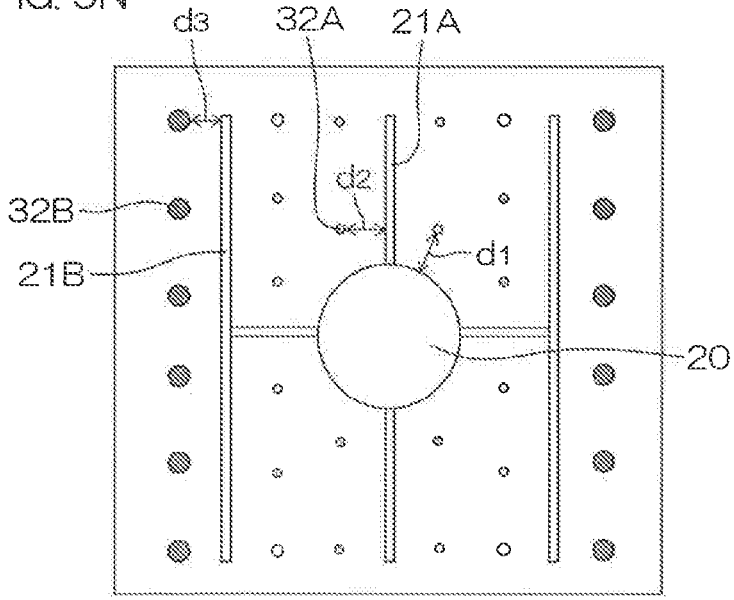
Figure 9O:
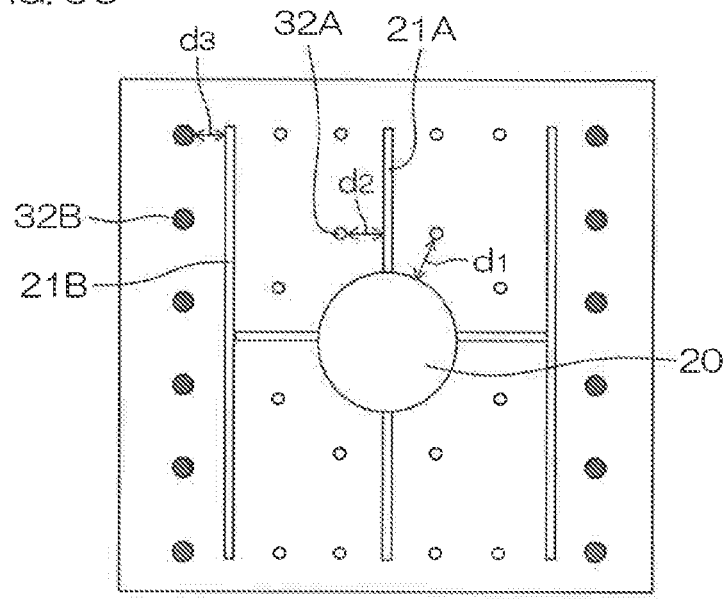
Figure 9P:
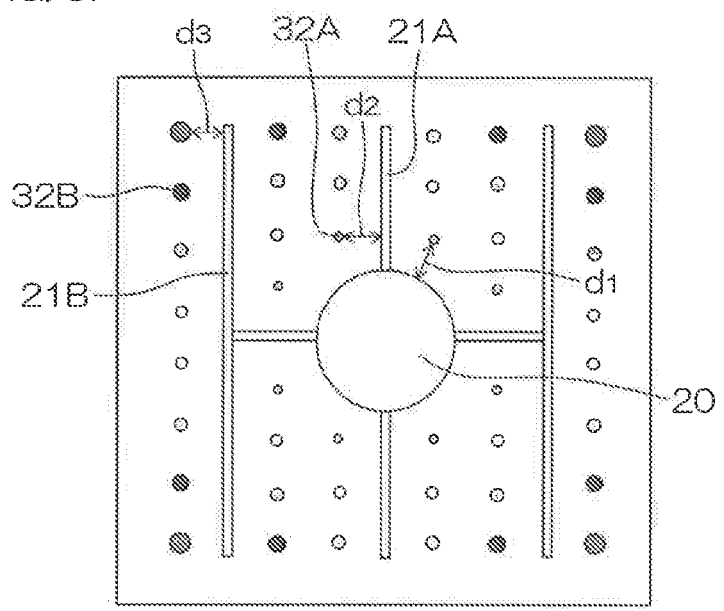
Figure 9Q:
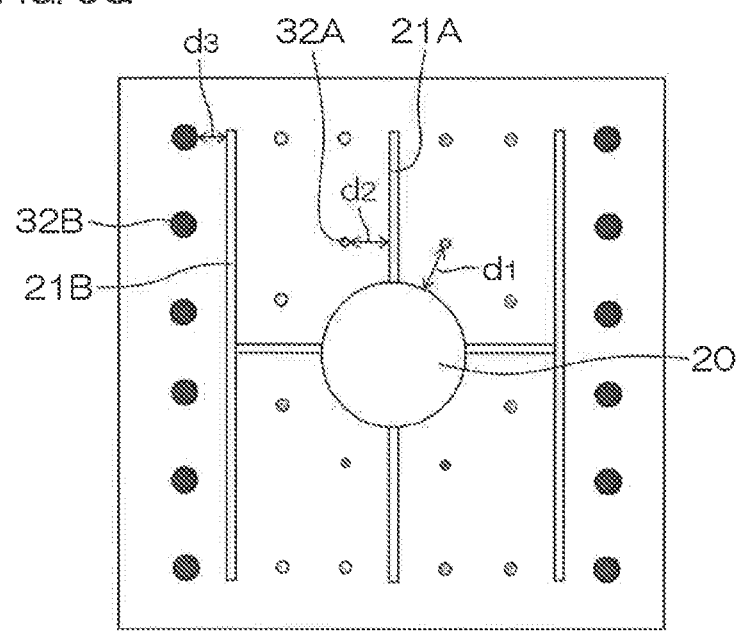
Figure 11:
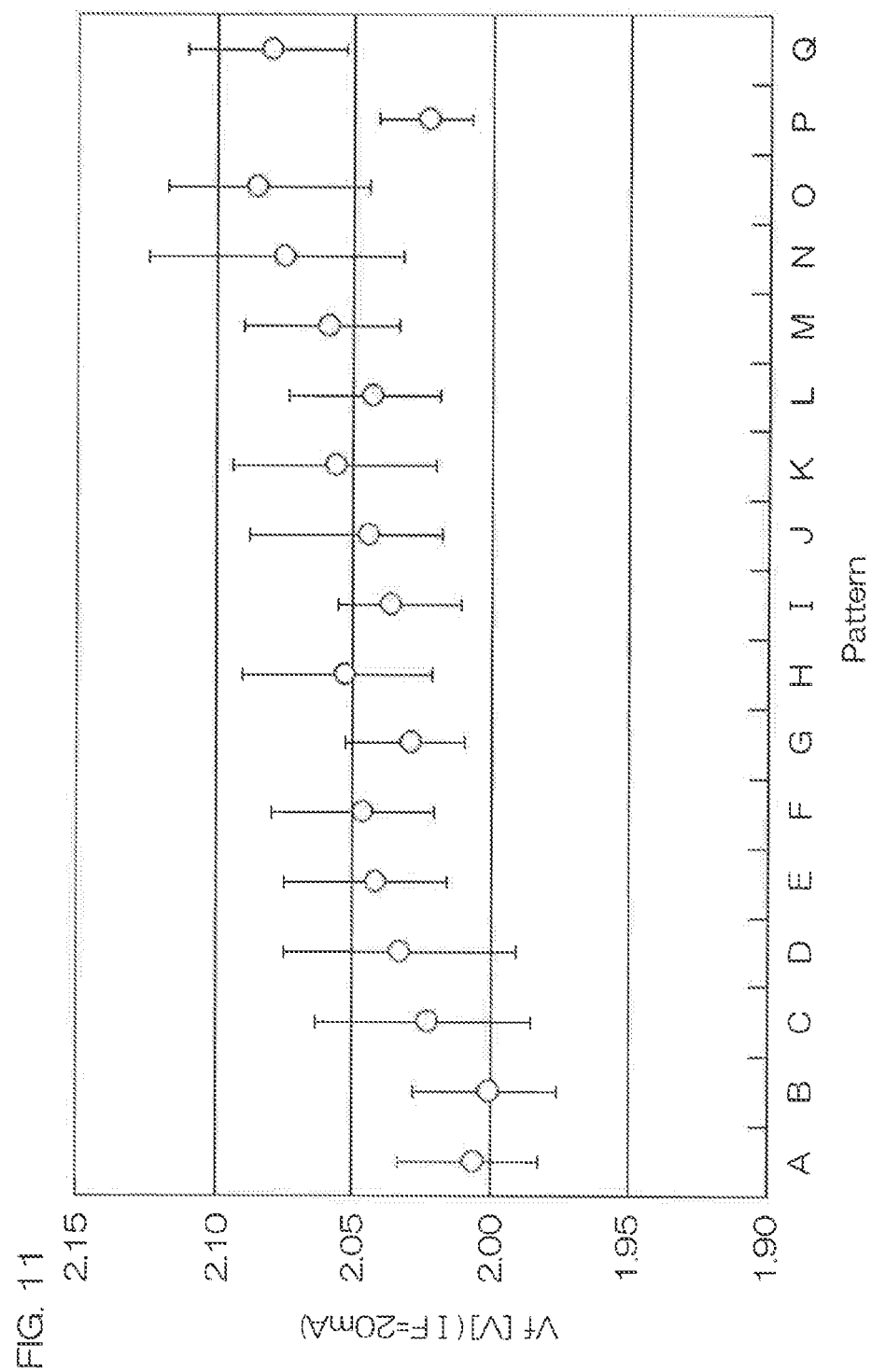
FIG. 11 is a view illustrating forward voltage (VF) of the patterns shown in FIGS. 9A to 9Q.

A semiconductor light-emitting element is manufactured under the conditions shown in FIGS. 9A to 9Q and Tables 1 and 2, and luminance (IV) and forward voltage (VF) are measured for each condition. The results are shown in FIGS. 10 and 11. As shown in FIGS. 10 and 11 and the Tables 1 and 2, higher levels of luminance are achieved under a low forward voltage in a pattern A that satisfies the relational expression: $d_1$>$d_2$>$d_3$.

TABLE 1

| Pattern | A | B | C | D | E | F | G | H | I |
|---|---|---|---|---|---|---|---|---|---|
| Figure number | FIG. 9A | FIG. 9B | FIG. 9C | FIG. 9D | FIG. 9E | FIG. 9F | FIG. 9G | FIG. 9H | FIG. 9I |
| Distance d1 [um] | 5 | ← | ← | ← | ← | ← | ← | ← | ← |
| Distance d2 [um] | 25 | 25 | ← | ← | ← | ← | ← | ← | ← |
| Distance d3 [um] | 20 | 25 | ← | ← | ← | ← | ← | ← | ← |
| Relational expression between d1, d2, and d3 | d1 > d2 > d3 | d1 > d2 = d3 | ← | ← | ← | ← | ← | ← | ← |
| Number of ODRs (contact portions) | 44 | 44 | 36 | 32 | 28 | 32 | 36 | 36 | 44 |
| ODR diameter (design value) [um] | 10.0 | 10.0 | 11.0 | 12.0 | 13.0 | — | — | — | 10.0 |
| ODR diameter (workmanship) [um] | 12.0 | 12.0 | 13.0 | 14.0 | 15.0 | — | — | — | 12.0 |
| ODR coverage | 5.53% | 5.53% | 5.31% | 5.47% | 5.50% | 4.31% | 4.31% | 4.26% | 4.26% |

TABLE 1-continued

| Pattern | | | A | B | C | D | E | F | G | H | I |
|---|---|---|---|---|---|---|---|---|---|---|---|
| Char- | Before | IV(IF = 10 mA) | 165.5 | 162.7 | 165.4 | 162.2 | 157.4 | 162.8 | 164.8 | 161.0 | 160.4 |
| acter- | frosting | VF(IF = 20 mA) | 2.01 | 2.00 | 2.02 | 2.03 | 2.04 | 2.04 | 2.05 | 2.03 | 2.04 |
| istics | | WD(IF = 5 mA) | 617.0 | 617.2 | 617.0 | 617.2 | 617.2 | 617.1 | 617.3 | 617.2 | 617.0 |
| | | IV compared to pattern A | — | 98.3% | 100.0% | 98.0% | 95.1% | 98.4% | 99.6% | 97.3% | 96.9% |

TABLE 2

| Pattern | | | J | K | L | M | N | O | P | Q |
|---|---|---|---|---|---|---|---|---|---|---|
| | | Figure number | FIG. 9J | FIG. 9K | FIG. 9L | FIG. 9M | FIG. 9N | FIG. 9O | FIG. 9P | FIG. 9Q |
| | | Distance d1 [um] | 5 | ← | ← | ← | ← | ← | ← | ← |
| | | Distance d2 [um] | 25 | ← | ← | ← | ← | ← | ← | ← |
| | | Distance d3 [um] | 25 | ← | ← | ← | ← | ← | ← | ← |
| | | Relational expression between d1, d2, and d3 | d1 > d2 = d3 | ← | ← | ← | ← | ← | ← | ← |
| | | Number of ODRss (contact portions) | 44 | 32 | 36 | 36 | 32 | 28 | 44 | 28 |
| | | ODR diameter (design value)[um] | — | — | 10.0 | — | — | — | — | — |
| | | ODR diameter (workmanship)[um] | — | — | 12.0 | — | — | — | — | — |
| | | ODR coverage | 4.27% | 4.30% | 4.52% | 3.49% | 3.51% | 3.50% | 4.28% | 4.29% |
| Char- | Before | IV(IF = 10 mA) | 161.3 | 157.8 | 165.4 | 167.6 | 160.3 | 157.4 | 164.5 | 155.7 |
| acter- | frosting | VF(IF = 20 mA) | 2.04 | 2.06 | 2.04 | 2.06 | 2.08 | 2.09 | 2.02 | 2.08 |
| istics | | WD(IF = 5 mA) | 616.9 | 617.1 | 617.4 | 617.0 | 617.3 | 617.3 | 617.3 | 617.2 |
| | | IV compared to pattern A | 97.5% | 95.4% | 100.0% | 101.3% | 96.9% | 95.1% | 99.4% | 94.1% |

(2) Evaluation with and without Branch-Shaped Electrode

Figure 13:
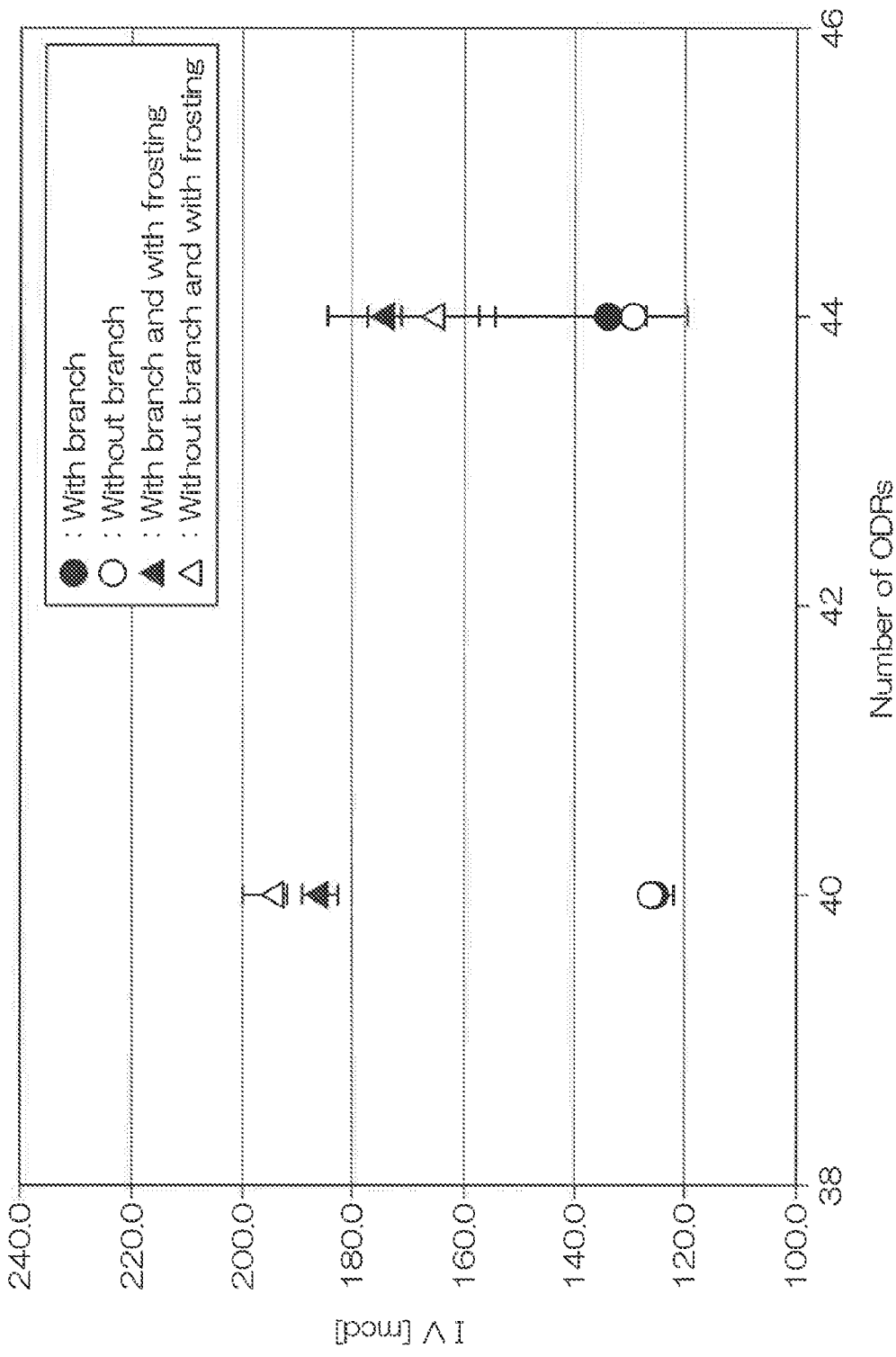
FIG. 13 is a view illustrating a relationship between the number of ODRs of the patterns shown in FIG. 12 and luminance (IV).
Figure 14:
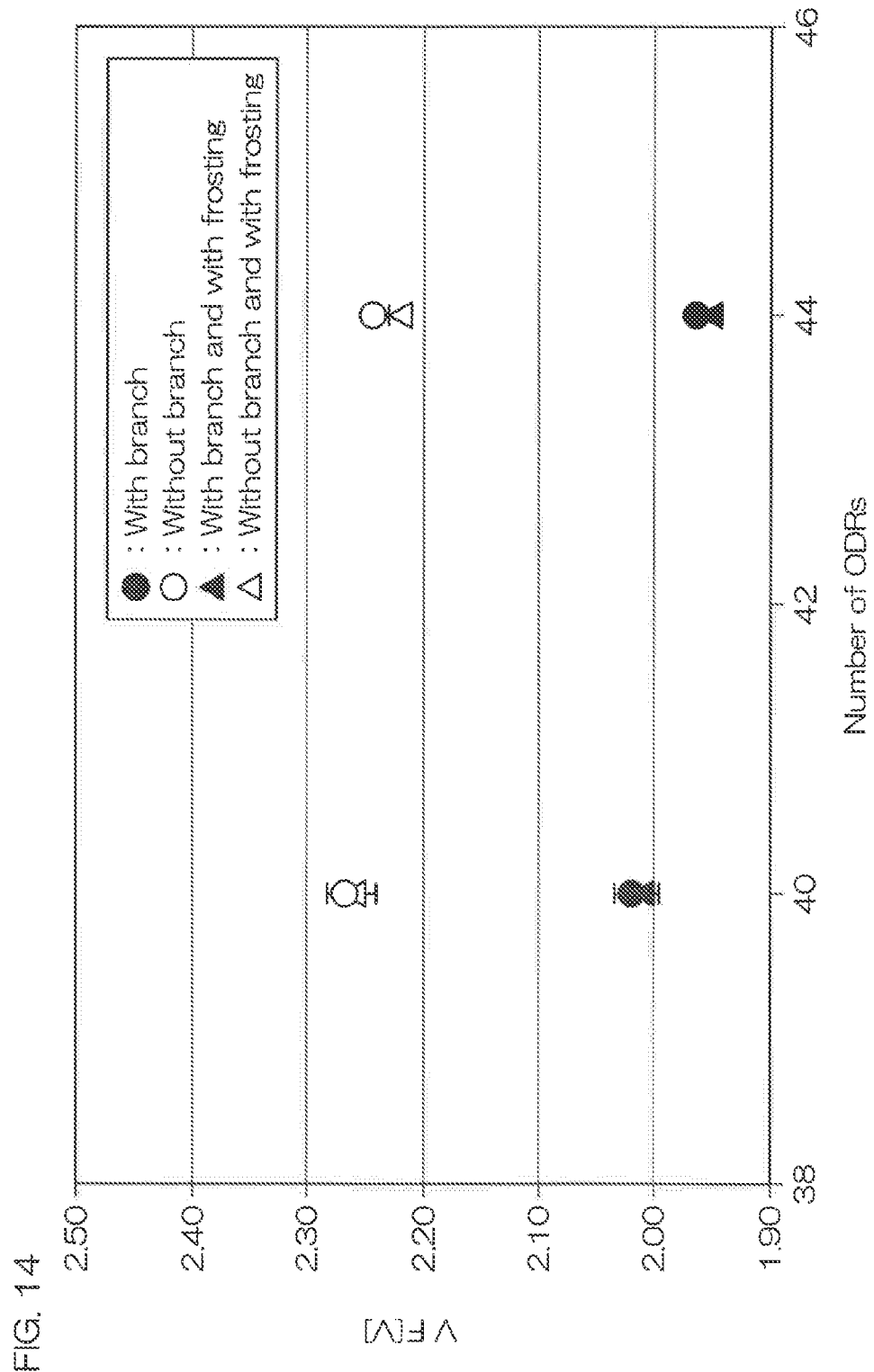
FIG. 14 is a view illustrating a relationship between the number of ODRs of the patterns shown in FIG. 12 and forward voltage (VF).

Semiconductor light-emitting elements having four types of patterns as shown in FIG. 12 are prepared. Totally eight pattern samples are created by preparing those with the fine irregular shape 19 formed on the surface of the mesa portion 17 by frosting and those with no such fine irregular shape 19, for each of these four types of patterns. The patterns on the right side sequentially from the top in FIG. 12 are the same as the previously described patterns in FIGS. 4 and 5, respectively. Then, luminances (IV) and forward voltages (VF) were measured for each evaluation sample. The results are shown in FIGS. 13 and 14. As shown in FIGS. 13 and 14, the pattern with a branch (with a branch-shaped electrode 21) achieved the same level of luminance (IV) under a low forward voltage (VF) as the pattern with no branch. Consequently, it was found that a lower forward voltage (VF) could be achieved by forming the branch-shaped electrodes 21 so as to extend between the discretely arranged ODRs (contact portions 32).

What is claimed is:

1. A semiconductor light-emitting element comprising:
a substrate;
a metal layer on the substrate such that the metal layer is in direct contact with the substrate;
a semiconductor layer formed on the metal layer, the semiconductor layer including
a light-emitting layer,
a first conductivity type layer arranged closer to the substrate than the light-emitting layer, and
a second conductivity type layer arranged opposite to the substrate across the light-emitting layer;
an insulating layer between the semiconductor layer and the metal layer;
a plurality of contact portions integrally formed with the metal layer and passing through the insulating layer, the plurality of contact portions discretely arranged substantially over an entire substrate area in a plan view, the plurality of contact portions electrically connecting the metal layer with the first conductivity type layer, and the plurality of contact portions made of a same material as the metal layer;
a surface electrode formed on the semiconductor layer, the surface electrode including a pad electrode and a branch-shaped electrode that extends from the pad electrode between the plurality of contact portions in the plan view; and
a rear surface electrode on a rear surface of the substrate, wherein
the second conductivity type layer has a surface and a side surface which are exposed from the surface electrode in the plan view,
the surface of the second conductivity type layer is rougher than the side surface of the second conductivity type layer,
the first conductivity type layer has a first layer including a drawn portion that is drawn in a lateral direction from the light-emitting layer such that the light-emitting layer is surrounded by the first layer of the first conductivity type layer in the plan view, a second layer formed on the first layer of the first conductivity type layer, the second layer having a side surface which is flush with a side surface of the light-emitting layer, and a third layer formed between the first layer of the first conductivity type layer and the insulating layer such that the third layer is in direct contact with the drawn portion,
the third layer of the first conductivity type layer has an impurity concentration higher than that of the first layer of the first conductivity type layer,
the plurality of contact portions are in direct contact with the third layer of the first conductivity type layer through the insulating layer, a surface of the drawn portion is continuous with a boundary surface between the first layer and the second layer, the second conductivity type layer has
- a first layer including the exposed surface and the exposed side surface, and
- a second layer formed on a surface of the first layer of the second conductivity type layer covered with the surface electrode, the second layer of the second conductivity type layer having a shape same as a shape of the surface electrode, a surface of the first layer of the second conductivity type layer has a surrounded region partitioned by the pad electrode and the branch-shaped electrode, and an outer peripheral region excluding the surrounded region, fine irregular shapes are formed in both the surrounded region and the outer peripheral region of the first layer of the second conductivity type layer, the branch-shaped electrode includes a first line electrode extending from the pad electrode in a first direction, a second line electrode spaced apart from the pad electrode and extending parallel to the first line electrode, and a third line electrode connecting the second line electrode with the pad electrode, the plurality of contact portions includes at least one first contact portion and at least one second contact portion, the at least one first contact portion includes a closest contact portion, among the plurality of contact portions, to both the pad electrode and the first line electrode, in the plan view, the at least one second contact portion includes a closest contact portion, among the plurality of contact portions, to the second line electrode, in the plan view, each at least one first contact portion is offset from each at least one second contact portion in the first direction, a line passing through the at least one first contact portion and extending in a second direction perpendicular to the first direction defines a first virtual straight line, a line passing through the at least one second contact portion and extending in the second direction defines a second virtual straight line, the first virtual straight line is spaced apart from the second virtual straight line in the first direction, and distances $d_1$, $d_2$, and $d_3$ satisfy the following relational expression:

$d_1 > d_2 > d_3$, wherein
- $d_1$ represents a shortest distance between the at least one first contact portion and the pad electrode in the plan view;
- $d_2$ represents a shortest distance between the at least one first contact portion and the first line electrode in the plan view; and
- $d_3$ represents a shortest distance between the at least one second contact portion and the second line electrode in the plan view.

2. The semiconductor light-emitting element according to claim 1, wherein
the semiconductor layer has a rectangular shape in the plan view; and
the pad electrode is arranged substantially in a center of the semiconductor layer.

3. The semiconductor light-emitting element according to claim 1, wherein
the semiconductor layer has a rectangular shape in plan view;
the pad electrode is arranged at one corner of the semiconductor layer; and the branch-shaped electrode extends from the pad electrode along the end surface that extends from the corner of the semiconductor layer where the pad electrode is arranged.

4. The semiconductor light-emitting element according to claim 1, wherein the insulating layer includes at least either an $SiO_2$ film or an SiN film.

5. The semiconductor light-emitting element according to claim 1, wherein a diameter of each contact portion is in a range of 8 µm to 15 µm.

6. The semiconductor light-emitting element according to claim 1, wherein the number of the plurality of contact portions is 28 to 60.

7. The semiconductor light-emitting element according to claim 1, wherein a coverage (contact portion area/light-emitting area) represented by the total area of the plurality of contact portions relative to the light-emitting area of the semiconductor light-emitting element is 6% to 40%.

8. The semiconductor light-emitting element according to claim 1, wherein the metal layer contains Au.

9. The semiconductor light-emitting element according to claim 1, wherein the substrate includes a silicon substrate.

10. The semiconductor light-emitting element according to claim 1, wherein the side surface of the second conductivity type layer is flush with a side surface of the light-emitting layer.

11. The semiconductor light-emitting element according to claim 1, wherein the second layer of the second conductivity type layer has an impurity concentration higher than an impurity concentration of the first layer of the second conductivity type layer.

12. The semiconductor light-emitting element according to claim 1, wherein the second layer of the second conductivity type layer has a thickness thinner than a thickness of the first layer of the second conductivity type layer.

13. The semiconductor light-emitting element according to claim 1, wherein the insulating layer is in direct contact with the semiconductor layer.

14. The semiconductor light-emitting element according to claim 1, wherein the at least one first contact portion includes a pair of the first contact portions that are line-symmetric with respect to the first line electrode.

15. The semiconductor light-emitting element according to claim 1, wherein
a plurality of the second contact portions are arranged parallel to the second line electrode at equal intervals, in the plan view,
the plurality of contact portions includes a plurality of third contact portions arranged parallel to the second line electrode at equal intervals, in the plan view,
the plurality of second contact portions are arranged farther from the pad electrode than from the second line electrode, in the plan view,
the plurality of third contact portions are arranged closer to the pad electrode than to the second line electrode, in the plan view, and
in the plan view, a distance between two adjacent second contact portions among the plurality of second contact portions is larger than a distance between two adjacent third contact portions among the plurality of third contact portions.

16. The semiconductor light-emitting element according to claim 15, wherein
the plurality of contact portions includes a plurality of fourth contact portions arranged parallel to the first line electrode, the at least one first contact portion and the plurality of fourth contact portions are arranged at equal intervals along a third virtual straight line, and in the plan view, a distance between two adjacent contact portions among the at least one first contact portion and the plurality of fourth contact portions is smaller than a distance between two adjacent third contact portions among the plurality of third contact portions.

\* \* \* \* \*